United States Patent [19]
Otsuchi et al.

[11] Patent Number: 6,098,460
[45] Date of Patent: Aug. 8, 2000

[54] ACCELERATION SENSOR AND SHOCK DETECTING DEVICE USING THE SAME

[75] Inventors: Tetsuro Otsuchi; Masato Sugimoto; Tetsuyoshi Ogura; Yoshihiro Tomita, all of Osaka; Osamu Kawasaki, Kyoto, all of Japan

[73] Assignee: Matsushita Electric Industrial Co., Ltd., Osaka, Japan

[21] Appl. No.: 08/727,302

[22] Filed: Oct. 8, 1996

[30] Foreign Application Priority Data

Oct. 9, 1995 [JP] Japan .................................. 7-261240
Jul. 31, 1996 [JP] Japan .................................. 8-201616

[51] Int. Cl.⁷ .................................................. G01P 15/09
[52] U.S. Cl. ........................................ 73/514.34; 310/331
[58] Field of Search ...................... 73/514.34, 514.35, 73/514.36, 514.38, 654; 310/329, 331; 340/669

[56] References Cited

U.S. PATENT DOCUMENTS

| | | |
|---|---|---|
| 3,735,161 | 5/1973 | Perkins et al. .......................... 310/329 |
| 4,812,698 | 3/1989 | Chida et al. ............................ 310/331 |
| 5,369,057 | 11/1994 | Lee et al. ............................... 73/514.35 |
| 5,413,955 | 5/1995 | Lee et al. ............................... 437/86 |
| 5,490,422 | 2/1996 | Tabota et al. ......................... 73/514.34 |
| 5,515,725 | 5/1996 | Tabota et al. ......................... 73/514.34 |

FOREIGN PATENT DOCUMENTS

| | | |
|---|---|---|
| 0369352 | 5/1990 | European Pat. Off. . |
| 0434878 | 7/1991 | European Pat. Off. . |
| 0616222 | 9/1994 | European Pat. Off. . |
| 654 671 | 5/1995 | European Pat. Off. . |
| 2 557 973 | 7/1985 | France . |
| 2 685 958 | 7/1993 | France . |
| 02248086 | 10/1990 | Japan . |
| 03092764 | 4/1991 | Japan . |
| 7-27784 | 1/1995 | Japan . |
| 07140165 | 6/1995 | Japan . |
| 07202283 | 8/1995 | Japan . |
| 07260819 | 10/1995 | Japan . |

OTHER PUBLICATIONS

Patent Abstacts of Japan, vol. 14, No. 573 (1990).
Patent Abstacts of Japan, vol. 95, No. 001 (1995).

*Primary Examiner*—John E. Chapman
*Attorney, Agent, or Firm*—Morrison & Foerster LLP

[57] ABSTRACT

A small accelaration sensor which is highly sensitive over a large frequency region and which varies little in characteristics such as sensitivity. A piezoelectric element is formed by connecting two main faces of retangular LiNbO₃ piezoelectric substrates, in which the polarization axes are directed oppositely. Supporters comprising LiNbO₃ directly connected to one end of the piezoelectric element. Eletrodes of chromium-gold being 0.2 μm are thick are successively connected to the two main faces of the piozoelectric element and to the supporters, thus to produce a cantilever structure bimorph electromechanical transducer.

27 Claims, 25 Drawing Sheets

ACCELERATION SENSOR AND SHOCK DETECTING DEVICE USING THE SAME

FIELD OF THE INVENTION

This invention relates to an acceleration sensor used for measurement of acceleration and for detection of vibration etc. and a method for producing the same. More specifically, this invention relates to a small, quality acceleration sensor and a method for producing the same. Moreover, this invention relates to a shock detecting device using the acceleration sensor, the output of which varies less than other sensors.

BACKGROUND OF THE INVENTION

Recently electronic devices have been more miniaturized and portable electronics devices including note-type personal computers have been widely used. A small, surface-mountable acceleration sensor with quality are more needed in order to certify the reliability of such electronic devices against shock.

A high-density hard disc can be taken as an example. If the disc is shocked during writing operation, the head is displaced and, as a result, the data cannot be written or the head itself can be damaged. In order to avoid such problems, it is necessary to detect shock to the head, and then stop writing or move the head to a safe position.

Demands for a shock detecting device acceleration sensor for an airbag apparatus are also increased so as to protect a driver from the shock caused by a car collision.

It is also needed to install a configuration in an apparatus which detects shock applied to a portable device and avoids failure or malfunction of the device due to the shock, or records the shock. Therefore, the needs for a small acceleration sensor used for such a device have been also increased.

Acceleration sensors employing piezoelectric materials such as piezoelectric ceramics have been well-known. Such an acceleration sensor can realize a high detection sensitivity by using the electromechanical conversion characteristics of the piezoelectric materials. A piezoelectric acceleration sensor outputs forces caused by acceleration or vibration after converting these forces into voltage by the piezoelectric effect. One example of such an acceleration sensor uses a cantilever structure rectangular bimorph electromechanical transducer as disclosed in Unexamined Japanese Patent Application (Tokkai-Hei) 2-248086. As shown in FIG. 26 of this application, a bimorph electromechanical transducer 50 using the piezoelectric effect is produced by fastening piezoelectric ceramics (51a, 51b) formed with electrodes (52a, 52b) with an adhesive 53 (e.g. epoxy resin). The cantilever structure shown in FIG. 27 is formed by adhering and fixing an end of the electromechanical transducer 50 to a fixing portion 55 with, for example, a conductive adhesive 54. Such a cantilever structure electromechanical transducer having low resonance frequency is used for measurement of acceleration having relatively low frequency components. In order to measure acceleration in a high frequency region, another type of bimorph electromechanical transducer 50, both of whose ends are fixed to fixing portions 55 with, for example, a conductive adhesive 54, is used (see FIG. 28). The resonance frequency can be relatively raised by fixing both ends of the electromechanical transducer (a structure clamped at both ends).

An acceleration sensor is formed by setting the electromechanical transducer 50 in a package while holding the fixing portion 55 to the inner wall of the package. Electric charge generated at the electrodes (52a, 52b) of the electromechanical transducer 50 is conducted out to outer electrodes via, for example, the conductive adhesive 54.

As mentioned above, adhesives including an epoxy resin are used to adhere the piezoelectric ceramics of conventional acceleration sensors. Young's modulus of the epoxy resin is $200 \times 10^{-12} m^2/N$, which is bigger than that of the piezoelectric ceramic ($150 \times 10^{-12} m^2/N$), so the epoxy resin absorbs the distortion of the electromechanical transducer due to acceleration, and as a result, the sensitivity deteriorates. In addition to that, it is still difficult to adhere piezoelectric ceramics while keeping the thickness of the adhering layer uniform, therefore, the characteristics of the electromechanical transducer will vary.

The resonance frequency of a rectangular bimorph electromechanical transducer should be stable in order to make its sensitivity stable. For this purpose, the electromechanical transducer should be fixed firmly. Actually, however, its metallic supporters or portions supported or fixed by fixing portions will be displaced because of stress generated mechanically or by temperature variation. For instance, if an electromechanical transducer is fixed by using adhesives, the fixing positions will change depending on the adhesive-application range, and thus its resonance frequency will vary. In another case, the fixing condition of the electromechanical transducer will depend on the temperature, so the stable fixing condition is not easily maintained.

In case electromechanical transducers are respectively produced and then set in packages, handling becomes difficult in the producing steps. As a result, the acceleration sensor cannot be miniaturized and quantity production becomes difficult.

The piezoelectric ceramic is produced by mixing and firing several kinds of materials, so, its material constants vary compared to that of a single crystal material. Therefore, sensitivity and capacitance considerably vary.

An acceleration sensor employing piezoelectric ceramics is also used to detect shock on a portable device. Such a device, however, considerably varies in its sensitivity, the standard acceleration range which is set to protect apparatuses from failure tends to be large, and, thus, precise shock detection becomes difficult. Due to the capacitance variation, it is difficult to design a circuit which is connected to the acceleration sensor in order to amplify electric signals generated from acceleration, and, thus, the amplifier degree of the circuit becomes irregular. As a result, the output signal considerably varies, and thus the acceleration sensor cannot reliably be used for shock detecting.

SUMMARY OF THE INVENTION

This invention aims to solve the above-mentioned problems of conventional techniques by providing a small acceleration sensor and a method for producing it. This acceleration sensor has high sensitivity in a large frequency region, and its characteristics including sensitivity are remarkably stable. Another purpose of this invention is to provide a shock detecting device using the acceleration sensor, whose output signals are quite stable.

In order to achieve this and other aims, a first acceleration sensor of this invention comprises an electromechanical transducer having a piezoelectric element formed by directly connecting at least two opposite main faces of at least two piezoelectric substrates and electrodes formed on the opposite main faces of the piezoelectric element, and supporters to support the electromechanical transducer. In this first acceleration sensor, the electromechanical transducer is constituted by directly connecting the piezoelectric substrates without using adhesive layers like adhesive materials. Therefore, if flexible vibration generates in the electromechanical transducer because of acceleration, nothing absorbs the flexible vibration. As a result, the piezoelectric substrates is stressed without loss, a great electromotive force can be obtained, and an acceleration sensor having high sensitivity can be provided. In addition to that, the variations in resonance frequency and sensitivity will considerably be reduced, since the adhesion between the piezoelectric substrates is uniform. Furthermore, the vibration characteristics of the electromechanical transducer do not change due to temperatures, since adhesive layers do not exist between the piezoelectric substrates.

It is preferable in the first acceleration sensor that the main faces of the two piezoelectric substrates are connected by bonding the atoms of the piezoelectric substrates via at least one group selected from the group consisting of oxygen and hydroxyl groups. In this preferred embodiment, the main faces of the two piezoelectric substrates are directly and firmly connected to each other at the atomic level.

It is preferable in the first acceleration sensor that the two piezoelectric substrates are connected to each other so that the directions of polarization axes are opposite to each other. In the preferred embodiment, an electric charge of the same polarity is generated on the two piezoelectric substrates even if the stresses generated in the piezoelectric substrates are different from each other, namely, compressive stress and tensile stress. Electromotive force is generated in the two piezoelectric substrates in the same direction. As a result, signals reflecting the degree of acceleration can be obtained from the electrodes formed on both faces of the electromechanical transducer.

It is preferable in the first acceleration sensor that the two piezoelectric substrates are directly connected via a buffer layer. In this preferred embodiment, strong direct-connecting faces are obtained, since the buffer layer absorbs waviness, irregularities, and foreign materials like contaminants on the adhered faces. In addition, when a material on which oxygen or hydroxyl groups are not easily formed by hydrophilic treatment is used, connection via a buffer layer will provide faces which are strongly and directly connected to each other.

It is preferable in the first acceleration sensor that an end of the electromechanical transducer is supported by supporters. In this preferred embodiment, an acceleration sensor having a cantilever structure can be provided.

It is more preferable in the first acceleration sensor that both ends of the electromechanical transducer are supported by supporters. In this preferred embodiment, an acceleration sensor having a both-ends clamped structure can be provided. This bothends clamped structure electromechanical transducer enables acceleration measurement in a higher frequency region, since the resonance frequency becomes higher compared to the case of a cantilever structure electromechanical transducer, if the length and thickness are common.

It is preferable in the first acceleration sensor that the piezoelectric substrates comprise single crystal piezoelectric materials of 3m crystal classes, and that the angle which the main face of the piezoelectric substrates makes with the Y axis is perpendicular to an axis of +129° to +152° and includes the X axis, and a line which links the center of gravity of the substrates to the center of the supporting portion is perpendicular to the X axis, where the X axis, Y axis and Z axis are the crystal axes of the single crystal piezoelectric materials. In this preferred embodiment, the piezoelectric constant of the piezoelectric substrates is 90 to 100% of the maximum value, and thus problems due to deterioration in sensitivity will not be found.

It is preferable in the first acceleration sensor that the piezoelectric substrates comprise single crystal piezoelectric materials of 3m crystal classes, and that the angle which the main face of the piezoelectric substrates makes with the Y axis is perpendicular to an axis of −26° to +26° and includes the X axis, and a line which links the center of gravity of the substrates to the center of the supporting portion is parallel to the X axis, where the X axis, Y axis and Z axis are the crystal axes of the single crystal piezoelectric materials. In this preferred embodiment, the piezoelectric constant of the piezoelectric substrates is 90 to 100% of the maximum value, and thus problems due to deterioration in sensitivity will not be found.

It is preferable in the first acceleration sensor that the piezoelectric substrates comprise single crystal piezoelectric materials of single crystal 32 crystal classes, and that the main face of the piezoelectric substrate is perpendicular to the X axis while a line which links the center of gravity of the substrates to the center of the supporting portion makes an angle of from +52° to +86° with the Z axis, where the X axis, Y axis and Z axis are the crystal axes of the single crystal piezoelectric materials. In this preferred embodiment, the piezoelectric constant of the piezoelectric substrates is 90 to 100% of the maximum value, and thus problems due to deterioration in sensitivity will not be found.

It is preferable in the first acceleration sensor that the piezoelectric substrates comprise single crystal piezoelectric materials of 32 crystal classes, and that the angle which the main face of the piezoelectric substrates makes with the X axis is perpendicular to an axis of −260 to +26° and includes the Y axis, and a line which links the center of gravity of the substrates to the center of the supporting portion is parallel to the Y axis, where the X axis, Y axis and Z axis are the crystal axes of the single crystal piezoelectric materials. In this preferred embodiment, the piezoelectric constant of the piezoelectric substrates is 90 to 100% of the maximum value, and thus problems due to deterioration in sensitivity will not be found.

It is preferable in the first acceleration sensor that the piezoelectric substrates comprise single crystal piezoelectric materials of 32 crystal classes, and that the angle which the main face of the piezoelectric substrates makes with the X axis is perpendicular to an axis of +52° to +68° and includes the Z axis, and a line which links the center of gravity of the substrates to the center of the supporting portion is perpendicular to the Z axis, where the X axis, Y axis and Z axis are the crystal axes of the single crystal piezoelectric materials. In this preferred embodiment, the piezoelectric constant of the piezoelectric substrates is 90 to 100% of the maximum value, and thus problems due to deterioration in sensitivity will not be found.

A second acceleration sensor of this invention comprises an electromechanical transducer having a piezoelectric element formed by connecting two opposite main faces of at least two piezoelectric substrates and electrodes formed on the two opposite main faces, and supporters to support the electromechanical transducer, where the electromechanical transducer is directly connected to the supporters. In this second acceleration sensor, the electromechanical transducer is produced by directly connecting the piezoelectric substrates without using adhesive layers. Therefore, the supporting position of the electromechanical transducer is less varied, and thus, an acceleration sensor having less varied a resonance frequency can be provided. In addition to that, acceleration can be transferred to the electromechanical transducer without loss, since the electromechanical transducer is directly connected to the supporters without using adhesives. Furthermore, the supporting condition will not change with temperature, since adhesive layers do not exist between the piezoelectric substrate and the supporters.

It is preferable in the second acceleration sensor that the piezoelectric substrates and the supporters are connected to each other by bonding the atoms composing the substrates and supporters via at least one group selected from the group consisting of oxygen and hydroxyl groups.

It is preferable in the second acceleration sensor that the piezoelectric substrates composing the electromechanical transducer and the supporters are directly bonded via a buffer layer.

It is also preferable in the second acceleration sensor that the piezoelectric substrates and the supporters compose the same materials. In this preferred embodiment, an acceleration sensor which is extremely stable under temperature variation can be provided, since it is not effected by distortion due to temperature.

It is preferable in the second acceleration sensor that an end of the electromechanical transducer is supported by the supporters.

It is more preferable in the second acceleration sensor that both ends of the electromechanical transducer are supported by the supporters.

A third acceleration sensor of this invention comprises an electromechanical transducer having a piezoelectric element formed by directly connecting two opposite main faces of at least two piezoelectric substrates and electrodes formed on the two opposite main faces, supporters to support the electromechanical transducer, and packages containing the electromechanical transducer, where the supporters are directly connected to the packages. In this third acceleration sensor, the supporters of the electromechanical transducer are directly connected to the packages without using adhesives, so the supporters are strongly connected to the packages. Therefore, a highly sensitive acceleration sensor in which acceleration generated on its mounting surface can be transferred to the supporters without loss via the packages.

It is preferable in the third acceleration sensor that the packages and the supporters are connected by bonding the atoms composing the packages and the supporters via one group selected from the group consisting of oxygen and hydroxyl groups.

It is preferable in the third acceleration sensor that the packages and the supporters are directly connected via a buffer layer.

It is also preferable in the third acceleration sensor that the packages and the supporters be comprised of the same materials.

A fourth acceleration sensor of this invention comprises an electromechanical transducer having a piezoelectric element formed by directly connecting two opposite main faces of at least two piezoelectric substrates and electrodes formed on the two opposite main faces, supporters to support the electromechanical transducer, and packages containing the electromechanical transducer, where the electromechanical transducer is supported by directly connecting the piezoelectric substrates composing the piezoelectric element to the packages. In this fourth acceleration sensor, the piezoelectric substrates are directly connected to the packages without using adhesives, so the electromechanical transducer is strongly connected to the packages. As a result, a highly sensitive acceleration sensor can be obtained since the acceleration the packages receive is transferred to the electromechanical transducer without loss. In addition to that, the sections of the acceleration sensor can be reduced since the packages function as the supporters.

It is preferable in the fourth acceleration sensor that the piezoelectric substrates and the packages are connected by bonding the atoms composing the piezoelectric substrates and the packages via one group selected from the group consisting of oxygen and hydroxyl groups.

It is preferable in the fourth acceleration sensor that the piezoelectric substrates and the packages are directly connected via a buffer layer.

It is also preferable in the fourth acceleration sensor that the piezoelectric substrates and the packages be comprised of the same materials.

It is preferable in the fourth acceleration sensor that a conductive layer is provided to the piezoelectric element excepting the electromechanical transducer. In this preferred embodiment, outer electrodes can be formed on the faces opposite to the supporting portions-even if the acceleration sensor has a cantilever structure. In this preferred embodiment, it is also possible to provide electrodes on all of the faces of the electromechanical transducer, and thus a highly sensitive acceleration sensor can be provided.

A fifth acceleration sensor of this invention comprises an electromechanical transducer having a piezoelectric element formed by directly connecting two opposite main faces of at least two piezoelectric substrates and electrodes formed on the two opposite main faces, supporters to support the electromechanical transducer, and packages being composed of at least two parts to contain the electromechanical transducer, where the two parts composing the packages are directly connected to each other. In this fifth acceleration sensor, the parts composing the packages are strongly connected to each other without using adhesives, so the heat resistance characteristics of the connected faces are improved. Therefore, the connecting parts do not generate gases even if solder reflow is conducted, and thus every part composing the packages is air-tight sealed. As a result, a reliable acceleration sensor whose characteristics do not deteriorate can be obtained.

It is preferable in the fifth acceleration sensor that the parts composing the packages are connected to each other by bonding their atoms via one group selected from the group consisting of oxygen and hydroxyl groups.

It is preferable in the fifth acceleration sensor that the parts composing the packages are directly connected to each other via a buffer layer.

In the first method of this invention for producing an acceleration sensor comprising an electromechanical transducer having piezoelectric element formed by connecting two opposite main faces of at least two piezoelectric substrates and electrodes formed on the opposite main faces of the piezoelectric element, and supporters to support the electromechanical transducer, wherein the piezoelectric element is formed by directly connecting the main faces of the two piezoelectric substrates, the electromechanical transducer is formed by directly connecting the piezoelectric substrates without using adhesive layers. As a result, an acceleration sensor where flexible vibration generated due to acceleration at its electromechanical transducer is not absorbed can be provided.

It is preferable in the first method that the main faces of the two piezoelectric substrates are directly connected by heat-treating after the piezoelectric substrates are hydrophilically treated and their main faces are connected to each other. In this preferred embodiment, the main faces of the two piezoelectric substrates are bonded firmly and directly at the atomic level via oxygen or hydroxyl groups.

In the second method of this invention for producing an acceleration sensor comprising an electromechanical transducer having piezoelectric element formed by connecting two opposite main faces of at least two piezoelectric substrates and electrodes formed on the opposite main faces of the piezoelectric element, and supporters to support the electromechanical transducer, wherein the piezoelectric element is formed by directly connecting the supporters to the piezoelectric substrates composing the piezoelectric element, the electromechanical transducer is directly connected to the supporters without using adhesives, and, thus, the variation of the supporting position of the electromechanical transducer is reduced. As a result, an acceleration sensor whose resonance frequency varies less can be obtained.

It is preferable in the second method that the supporters and the piezoelectric substrates are directly connected by heat-treating after the supporters and the piezoelectric substrates are hydrophilically treated and connected to each other.

In the third method of this invention for producing an acceleration sensor comprising an electromechanical transducer having piezoelectric element formed by connecting opposing main faces of at least two piezoelectric substrates and electrodes formed on the opposing main faces of the piezoelectric element, supporters to support the electromechanical transducer, and packages to contain the electromechanical transducer, wherein the supporters are connected to the package directly and firmly, acceleration generated on the mounting surface can be transferred to the supporters via the packages without loss, and a high sensitive acceleration sensor can be obtained.

It is preferable in the third method that the supporters are directly connected to the packages by heat-treating after the supporters and the packages are hydrophilically treated and connected to each other.

In the fourth method of this invention for producing an acceleration sensor comprising an electromechanical transducer having piezoelectric element formed by connecting two opposite main faces of at least two piezoelectric substrates and electrodes formed on the opposite main faces of the piezoelectric element, and packages to contain the electromechanical transducer, wherein the piezoelectric substrates composing the piezoelectric element are directly connected to the packages, the electromechanical transducer can be connected firmly to the packages. As a result, acceleration the packages receive can be transferred to the electromechanical transducer without loss, and a highly sensitive acceleration sensor can be obtained. In addition to that, the sections of the acceleration sensor can be reduced since the packages function as the supporters, and the production process can be simplified.

It is preferable in the fourth method that the piezoelectric substrates are directly connected to the packages by heat-treating after the piezoelectric substrates and the packages are hydrophilically treated and connected to each other.

In the fifth method of this invention for producing an acceleration sensor comprising an electromechanical transducer having a piezoelectric element formed by connecting two opposite main faces of at least two piezoelectric substrates and electrodes formed on the opposite main faces of the piezoelectric element, supporters to support the electromechanical transducer, and packages comprising at least two parts in order to contain the electromechanical transducer, wherein the parts of the packages are directly connected to each other, the parts composing the packages are firmly connected to each other without using adhesives, and thus the heat resistance properties of the connected faces are improved. As a result, gases are not generated from the connected part even if solder reflow is conducted, and each parts of the packages are air-tight sealed. Therefore, a reliable acceleration sensor whose characteristics do not deteriorate can be obtained.

It is preferable in the fifth method that the parts of the packages are directly connected to each other by heat-treating after the parts of the packages are hydrophilically treated and connected to each other.

A sixth method of this invention for producing an acceleration sensor comprising an electromechanical transducer having a piezoelectric element formed by connecting two opposite main faces of at least two piezoelectric substrates and electrodes formed on the opposite main faces of the piezoelectric element, and packages to contain the electromechanical transducer comprising the following processes:

forming plural piezoelectric elements by directly connecting at least two piezoelectric substrates on which plural cantilevers or both-ends clamped structures are pattern-formed;

directly connecting the packages to the piezoelectric substrates, the packages being formed with concavities to correspond to the piezoelectric elements; and separating the acceleration sensor into individual acceleration sensors containing the piezoelectric elements. In this sixth method, the electromechanical transducers are pattern-formed from the piezoelectric substrates, and thus, the shape of the electromechanical transducer is less varied. Since the electromechanical transducer and the supporters are formed simultaneously, the supporting condition of the electromechanical transducer is quite stable. Therefore, the cantilever or a beam clamped on both ends does not vary much in length, and as a result, an acceleration sensor which has very little variation in characteristics, such as resonance frequency, can be obtained. In addition, the materials of the electromechanical transducer, the supporters and the packages are the same, so an extremely stable acceleration sensor can be provided without the influence of distortion due to temperature. Another advantage of this embodiment is superior quantity productivity, since a number of acceleration sensors can be produced at a time on a substrate.

It is preferable in the sixth method of this invention that electrodes are formed on the two opposite main faces of the piezoelectric element after the formation of the piezoelectric element. In this preferred embodiment, a mask can be located easily when the electrodes are formed, and also the electrodes can be formed on the piezoelectric elements precisely, since the piezoelectric elements are already formed. As a result, a precise electromechanical transducer can be provided. In this case, it is also preferable that conductive layer be formed on the piezoelectric substrate when the electrodes are formed on the two opposite main faces of the piezoelectric elements, so that the producing processes can be simplified.

It is further preferable in the sixth method of this invention that a cantilever or a beam clamped on both ends is pattern-formed after the electrodes are formed on the piezoelectric substrates. In this preferred embodiment, an electromechanical transducer can be produced without positioning the electrodes precisely. If a piezoelectric element is thin, a short-circuit of the front and back electrodes can occur as the electrodes are formed after the cantilever is pattern-formed. In this preferred embodiment, however, such a problem can be prevented. It is preferable in this embodiment that a conductive layer is formed on the piezoelectric substrate when the electrodes are formed.

A seventh method of this invention for producing an acceleration sensor comprising an electromechanical transducer having a piezoelectric element formed by connecting two opposite main faces of at least two piezoelectric substrates and electrodes formed on the opposite main faces of the piezoelectric element, and packages to contain the electromechanical transducer comprises the following processes:

- forming plural piezoelectric elements by pattern-forming plural cantilevers or a beam having both-ends structure after directly connecting at least two piezoelectric substrates;
- directly connecting the packages to the piezoelectric substrates, the packages being formed with concavities to correspond to the piezoelectric elements; and
- separating the acceleration sensor into individual acceleration sensors containing the piezoelectric elements.

It is preferable in the seventh method of this invention that electrodes are formed on the two opposite main faces of the piezoelectric element after the formation of the piezoelectric element. In this case, it is also preferable that a conductive layer is formed on the piezoelectric substrates when the electrodes are formed on the two opposite main faces of the piezoelectric elements, so that the producing processes can be simplified.

It is further preferable in the seventh method of this invention that a cantilever or a beam clamped on both ends is pattern-formed after the electrodes are formed on the piezoelectric substrates. It is preferable in this embodiment that a conductive layer is formed on the piezoelectric substrate when the electrodes are formed.

A shock detecting device of this invention comprises:

- an acceleration sensor provided with an electromechanical transducer comprising piezoelectric elements configured by connecting two opposite main faces of at least two piezoelectric substrates and electrodes formed on the main faces, and supporters to support the electromechanical transducer;
- an amplifier circuit which converts and amplifies signals from the acceleration sensor;
- a comparator circuit which compares the signals from the amplifier circuit with standard signals;
- a control circuit which controls the apparatus in which the acceleration sensor is included; and
- a storage device to store shock. The shock detecting device can measure acceleration precisely since there is no variation in sensitivity of the acceleration sensor or in its capacitance. Therefore, the shock detecting device can detect and analyze shocks precisely by using the comparator circuit depending on the standard values, while it can also instruct recording of the detected shock and protect the apparatus from the shock by analysis at its control circuit.

DETAILED DESCRIPTION OF THE INVENTION

The First Embodiment

Figure 1:
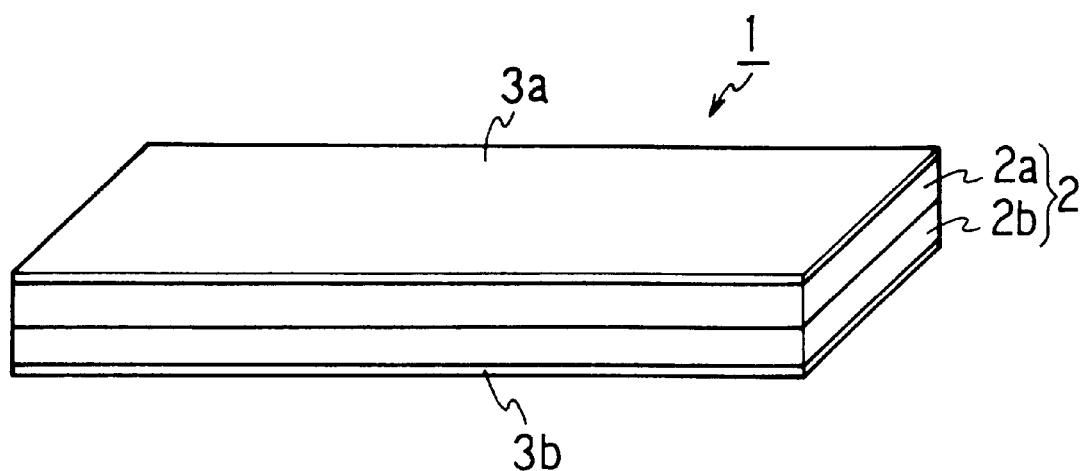
FIG. 1 is a perspective view showing an electromechanical transducer used for an acceleration sensor of the first embodiment of this invention.

FIG. 1 is a perspective view of an electromechanical transducer used for an acceleration sensor of the first embodiment of this invention. As shown in FIG. 1, a piezoelectric element 2 is formed by directly connecting two opposite main faces of piezoelectric substrates (2a, 2b) which comprise lithium niobate ($LiNbO_3$). The rectangular piezoelectric substrates are 50 μm thick, 0.5 mm wide, 2 mm long. The piezoelectric substrates (2a, 2b) are connected so that their polarization axes are directed oppositely. Electrodes (3a, 3b) comprising 0.2 μm thick of chromium-gold are respectively formed on the two opposite main faces of the piezoelectric element, forming a bimorph electromechanical transducer 1.

A method for producing such an electromechanical transducer is explained below.

Figure 2A:
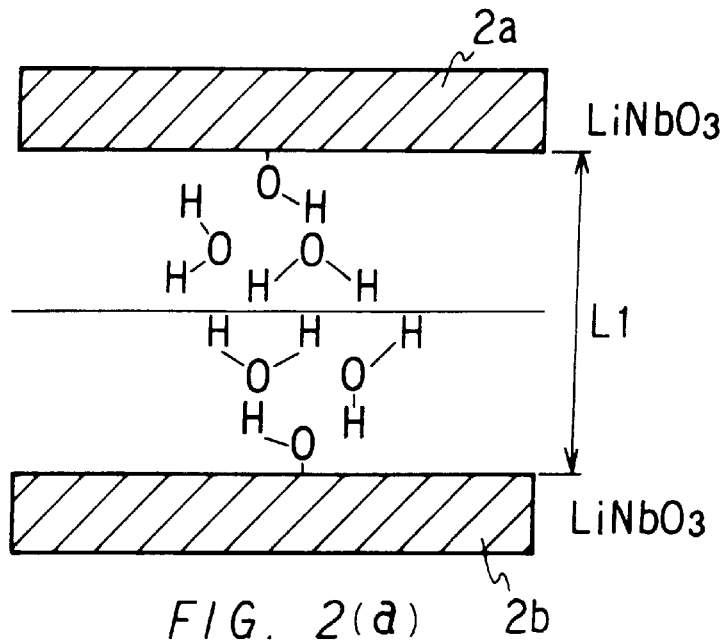
FIGS. 2(a)–2(c) are flow diagrams which show the interface conditions of the piezoelectric substrate in each step of direct connection in producing an electromechanical transducer used for an acceleration sensor of the first embodiment of this invention.
Figure 2B:
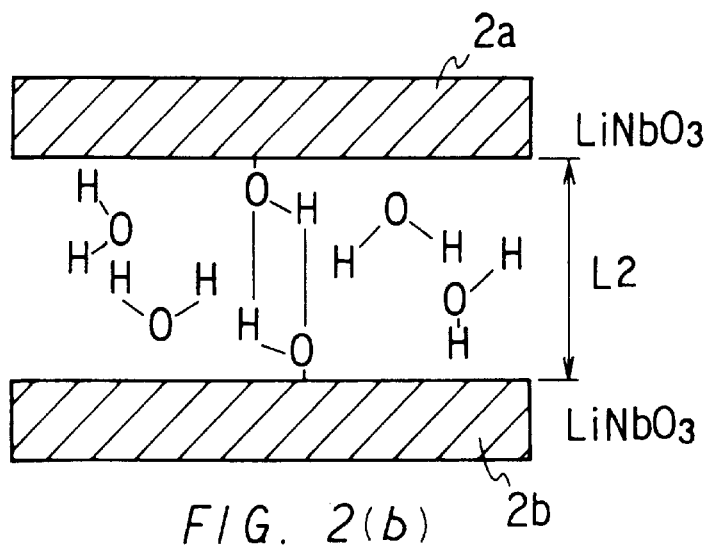
Figure 2C:
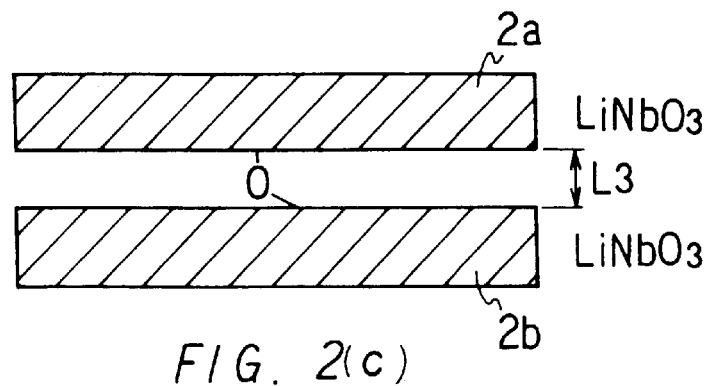

FIGS. 2(a)–2(c) are flow diagrams showing the interface conditions of the piezoelectric substrates in each step of direct connection in producing an electromechanical transducer used for an acceleration sensor of the first embodiment of this invention. $L_1$, $L_2$ and $L_3$ in FIGS. 2(a)–(c) indicate distance between the piezoelectric substrates. First, both sides of the two $LiNbO_3$ substrates (piezoelectric substrates (2a, 2b)) were mirror-polished. Then, the piezoelectric substrates (2a, 2b) were hydrophilically treated by washing them in a mixture of ammonia, hydrogen peroxide and water (ammonia water:hydrogen peroxide water:water=1:1:6 in volume). As shown in FIG. 2(a), the surfaces of the washed piezoelectric substrates (2a, 2b) are ended with hydroxyl groups (—OH groups) and become hydrophilic (pre-connection condition).

In the next step, the two hydrophilic-treated piezoelectric substrates $LiNbO_3$ (2a, 2b) were connected so that the polarization axes are oppositely directed ($L_1 > L_2$). As a result, the piezoelectric substrates 2a and 2b are connected by attraction like —OH bonding or hydrogen bonding due to dehydration.

The connected piezoelectric substrates (2a, 2b) were heat-treated at 450° C. As shown in FIG. 2(c), atoms composing the piezoelectric substrate 2a and those of the piezoelectric substrate 2b are covalently bonded ($L_2 > L_3$) via oxygen (O), and thus the piezoelectric substrates (2a, 2b) were firmly and directly connected at the atomic level. In other words, a bonding having no adhesive layer (e.g. adhesives) on the interface was obtained. In another embodiment, the atoms composing the two piezoelectric substrates can be covalently bonded via hydroxyl groups and the piezoelectric substrates can be firmly and directly connected at the atomic level.

$LiNbO_3$'s Curie-point is 1210° C., and its characteristics will deteriorate if its temperature history approaches that point. Therefore, it is preferable that heat-treatment is conducted below the Curie-point.

A "direct connection" is a connection generated between the interfaces directly without any adhesive layer like adhesive materials. For such a direct connection, mirror-polished faces of materials to be connected are surface-treated and contacted with each other. In general, heat-treatment makes a connection by intermolecular force to a strong connection at the atomic level, such as covalent bonding and ionic bonding.

Next, chromium-gold was evaporated by vacuum evaporation on the two opposite main faces of the piezoelectric element 2 which is made up of directly connected piezoelectric substrates $LiNbO_3$ (2a, 2b), so that the electrodes (3a, 3b) were formed (see FIG. 1). In the end, a bimorph electromechanical transducer 1 was produced by cutting the piezoelectric element 2 into strips of predetermined size by using a dicing saw.

Figure 3:
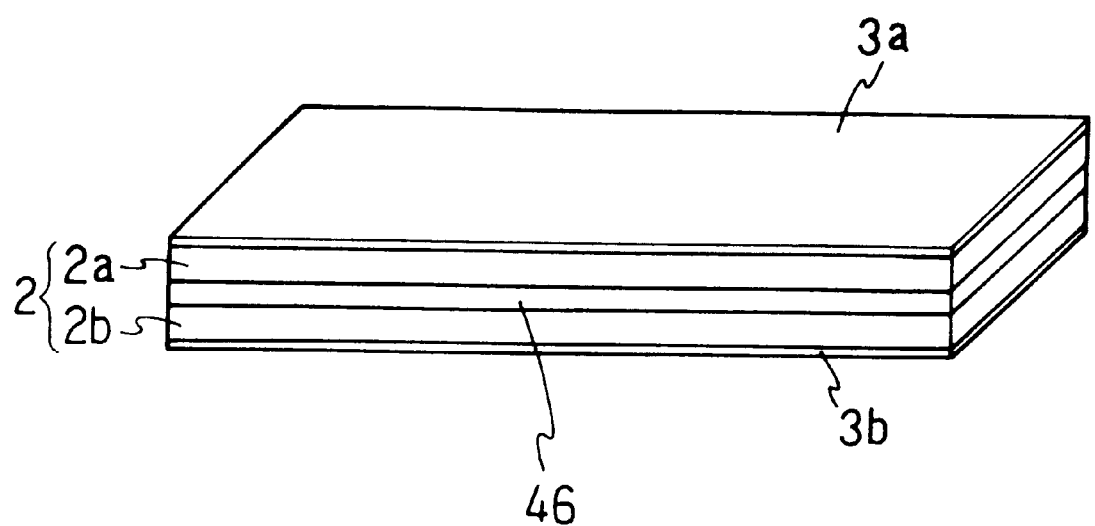
FIG. 3 is a perspective view showing another example of an electromechanical transducer used for an acceleration sensor of the first embodiment of this invention.

As shown in FIG. 3, direct connection can be conducted via a buffer layer 46 comprising, for example, a silicon oxide thin film. More specifically, a buffer layer 46 comprising 0.1 μm thick of silicon oxide thin film is formed on a main face of the piezoelectric substrate 2a. After the buffer layer 46 and the other piezoelectric substrate 2b are hydrophilically treated, they are laminated and heat-treated, so that the atoms composing the piezoelectric substrate 2b and those composing the buffer layer 46 are connected via oxygen or via hydroxyl groups. Even if faces to be connected have waviness or irregularities, or even if foreign matter like contaminants are stuck to the face, the buffer layer 46 will absorb them, so direct connection can be conducted easily. When materials on which oxygen or hydroxyl groups are hard to form by hydrophilic treatment, direct connection can be conducted easily via the buffer layer 46. In this embodiment, the buffer layer can be provided on one side or both sides of the faces to be connected. Not only silicon oxide, but silicon nitride and metallic silicide etc. can be used for the buffer layer.

Figure 4:
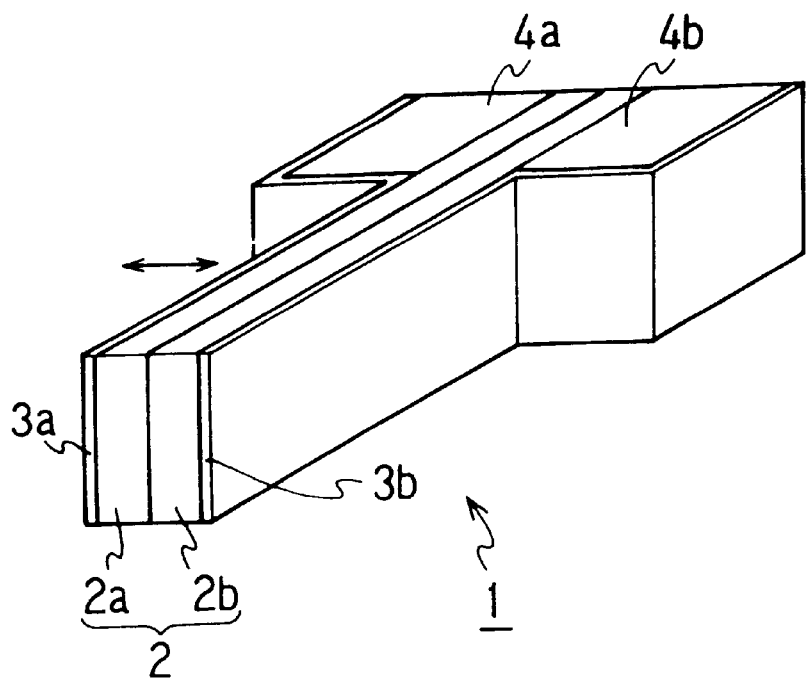
FIG. 4 is a perspective view showing a cantilever structure bimorph electromechanical transducer of the first embodiment of this invention.
Figure 5:
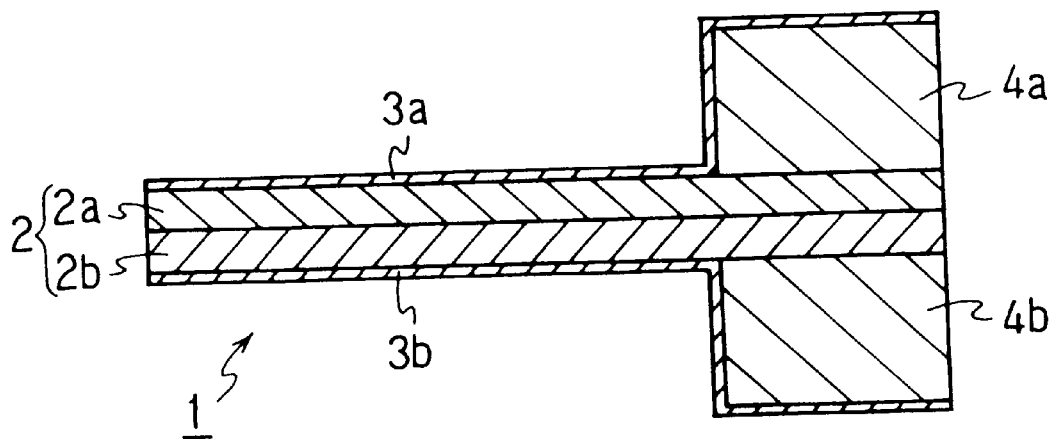
FIG. 5 is a cross-sectional view showing a cantilever structure bimorph electromechanical transducer of the first embodiment of this invention.

FIG. 4 is a perspective view showing a cantilever structure bimorph electromechanical transducer of the first embodiment of this invention, and FIG. 5 is a cross-sectional view of the same electromechanical transducer. As shown in FIGS. 4 and 5, a piezoelectric element 2 is formed by directly connecting two opposite main faces of piezoelectric substrates (2a, 2b) which comprise lithium niobate ($LiNbO_3$). The rectangular piezoelectric substrates are 50 μm thick, 0.5 mm wide, and 2 mm long. The piezoelectric substrates (2a, 2b) are connected so that their polarization axes are directed oppositely. One end of the piezoelectric element 2 is sandwiched by supporters (4a, 4b) comprising $LiNbO_3$ and fixed. The piezoelectric element 2 is directly connected to the supporters (4a, 4b). In this embodiment, the piezoelectric element 2 and the supporters (4a, 4b) can be also directly connected via a buffer layer comprising, for example, a silicon oxide thin film. Electrodes (3a, 3b) comprising 0.2 μm thick of chromium-gold are respectively formed on the two opposite main faces of the piezoelectric element and these electrodes are formed successively on the supporters (4a, 4b), and thus, a cantilever structure bimorph electromechanical transducer 1 is formed.

Figure 6:
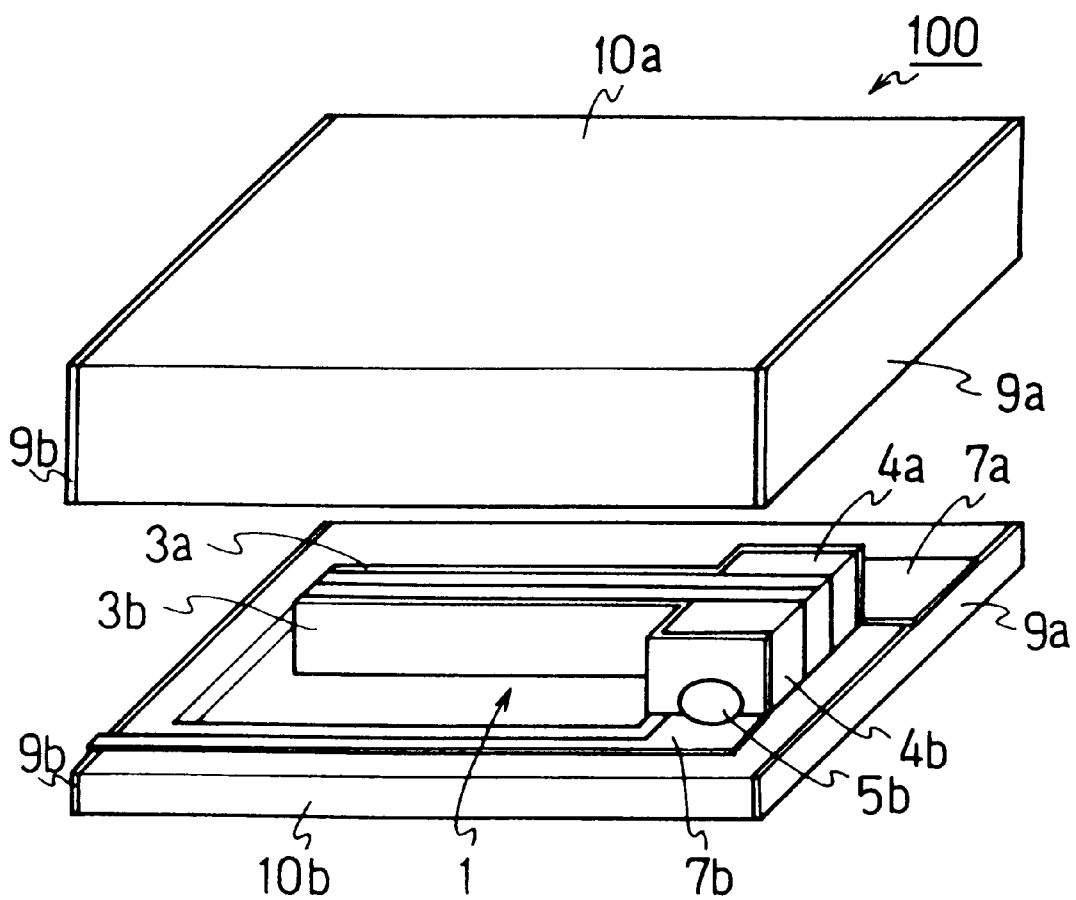
FIG. 6 is an exploded perspective view showing an example of an acceleration sensor of the first embodiment of this invention.

FIG. 6 is an exploded perspective view of an example of an acceleration sensor of the first embodiment of this invention. As shown in FIG. 6, a cantilever structure bimorph electromechanical transducer 1 is set in a package 10b comprising LiNbO$_3$. A depression is formed in the center of the package 10b by etching etc. In other words, the supporters (4a, 4b) of the bimorph electromechanical transducer 1 are fixed in the package 10b by conductive pastes (5a, 5b; 5a is not seen) in the condition that the bimorph electromechanical transducer 1 excepting the supporters (4a, 4b) is maintained above the depression. Another LiNbO$_3$ package 10a is overwrapped in the package 10b and adhered to it. The package 10a is also provided with a depression (not shown) at its center. Therefore, the whole of the bimorph electromechanical transducer 1 is covered with the packages (10a, 10b). Conductive layers (7a, 7b) comprising silver-palladium are formed inside the package 10b. One end of each conductive layer (7a, or 7b) is electrically connected to the electrode (3a, or 3b) of the bimorph electromechanical transducer 1 via the conductive paste (5a, or 5b). Outer electrodes (9a, 9b) comprising nickel are formed on both ends of the packages (10a, 10b). The other ends of the conductive layers (7a, 7b) are electrically connected to the outer electrodes (9a, 9b). In other words, the electrodes (3a, 3b) of the bimorph electromechanical transducer 1 are electrically connected to the outer electrodes (9a, 9b) respectively via the conductive pastes (5a, 5b) and via the conductive layers (7a, 7b). As a result, electric charge generated in the bimorph electromechanical transducer 1 can be run out. An acceleration sensor 100 has the configuration mentioned above.

Figure 7:
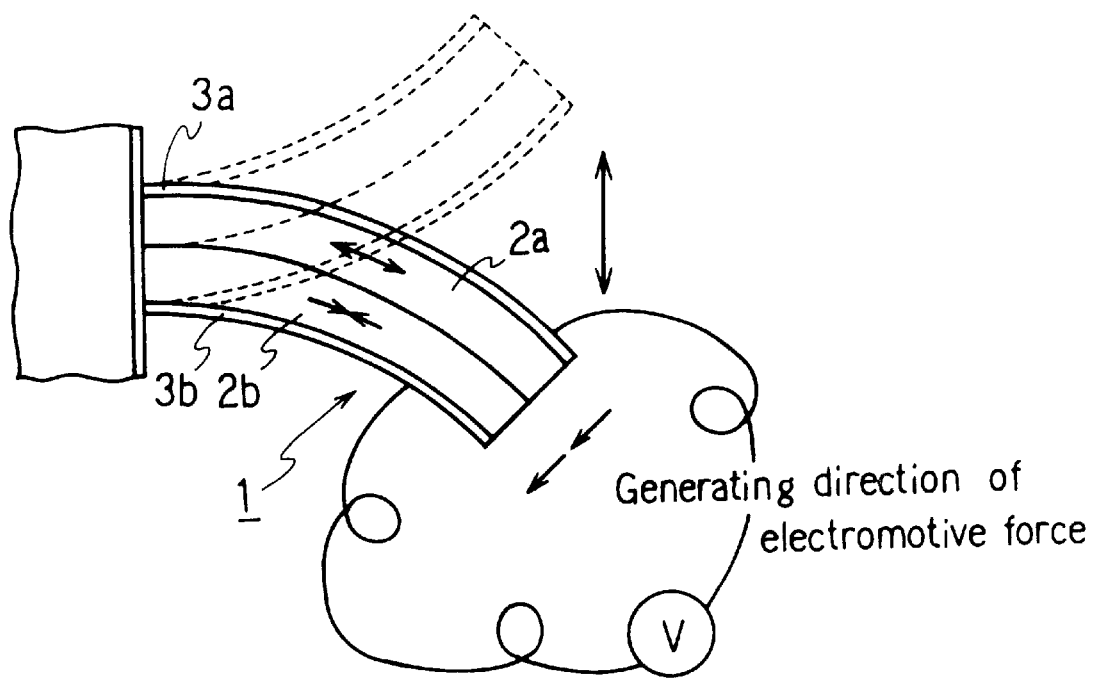
FIG. 7 is an explanatory view showing where flexible vibration is generated in the cantilever structure bimorph electromechanical transducer of the first embodiment of this invention.

If something attached to the acceleration sensor 100 shown in FIG. 6 is accelerated, a force proportional to the acceleration is transferred to the electromechanical transducer 1 via the packages (10a, 10b) and the supporters (4a, 4b). If vertical acceleration (arrow in FIG. 4) is generated, the electromechanical transducer 1 bends vertically and thus, flexible vibration occurs (see FIG. 7). When the electromechanical transducer 1 comprising the piezoelectric substrates (2a, 2b) bends downward (solid line in FIG. 7), the piezoelectric substrate 2a is distorted (becomes long) due to tensile force, since the piezoelectric substrate 2a is located above the central axis of the electromechanical transducer 1. On the other hand, the piezoelectric substrate 2b which is located below the central axis of the electromechanical transducer 1 is distorted (shrinks) due to compressive force.

In a conventional electromechanical transducer produced by adhering piezoelectric ceramic substrates, adhesives softer than the piezoelectric substrates exist between the substrates. Therefore, when the electromechanical transducer bends vertically, the flexible vibration is absorbed by the adhesive materials, and as a result, stress generated on the piezoelectric substrates is decreased, and so is the electromotive force generated on the piezoelectric substrates.

On the other hand, the electromechanical transducer 1 of this invention is produced by directly connecting the piezoelectric substrates (2a, 2b), so there is no adhesive layer like adhesives between the piezoelectric substrates 2a and 2b. Namely, when flexible vibration occurs on the electromechanical transducer 1 because of acceleration, nothing will absorb this flexible vibration. Therefore, stress generates at the piezoelectric substrates (2a, 2b), and great electromotive force can be obtained. As a result, a highly sensitive acceleration sensor can be provided. In addition to that, variation of resonance frequency of the electromechanical transducer 1 can be remarkably reduced and sensitivity thus increases, since the piezoelectric substrates (2a, 2b) connection becomes uniform. Furthermore, the vibration characteristics of the electromechanical transducer 1 do not vary depending on temperature, since adhesive layers do not exist between the piezoelectric substrates (2a, 2b).

The supporters (4a, 4b) are firmly connected to the electromechanical transducer 1 at the atomic level, and thus the acceleration given to the matter having the packages (10a, 10b) is transferred to the electromechanical transducer 1 without loss.

Though electric charge corresponding to compressive stress and tensile stress is generated on the upper and lower faces of the piezoelectric substrates (2a, 2b) comprising LiNbO$_3$, electric charge of the same polarity generates on the two piezoelectric substrates even if the stress generated on the substrates differs from the compressive stress and tensile stress, since the piezoelectric substrates (2a, 2b) are connected to each other so that the direction of their polarization axes is the opposite. Namely, electromotive force occurs on the piezoelectric substrates (2a, 2b) in the same direction (see FIG. 7). Therefore, signals reflecting the acceleration can be obtained from the electrodes (3a, 3b) formed on both faces of the electromechanical transducer 1. When the thickness direction of the LiNbO$_3$ substrate is predetermined to be the Y' axis direction and the longitudinal direction is the Z' direction, the compressive force and the tensile force act in the Z' axis direction while the electric charge is generated in the Y' direction. In this case, the quantity of the generated charge is largely depends on piezoelectric coefficient $d_{23}'$. The value of the piezoelectric coefficient $d_{23}'$ greatly varies depending on the directions of the Y' and Z' axes to the crystal axis. Namely, the sensitivity of the acceleration sensor greatly varies depending on the directions of the Y' and Z' axes. The best sensitive acceleration sensor can be obtained when the Y' and Z' axes are set properly and cut angle is selected in order to have the largest absolute value of the piezoelectric coefficient $d_{23}'$.

Figure 8:
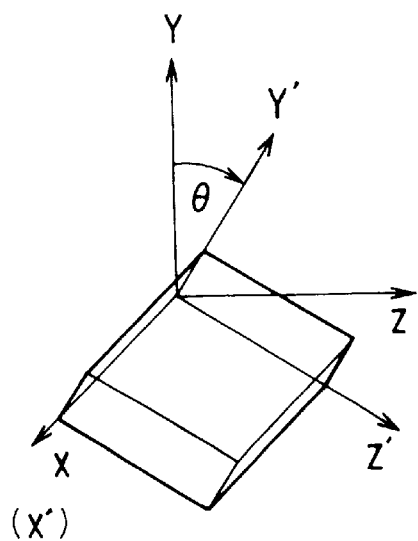
FIG. 8 is a diagram showing the relationship between the crystal axis of the piezoelectric substrate and the cut angle.

FIG. 8 is a diagram showing the relationship between the crystal axis of the piezoelectric substrate and a cut angle. In FIG. 8, the X axis, Y axis and Z axis indicate the crystal axis direction of LiNbO$_3$, while the X' axis (=X axis), Y' axis and Z' axis indicate the perpendicular axis where the Y axis is rotated by θ degrees with respect to the X axis. Namely, the X' axis (=X axis), Y' axis and Z' axis indicate the cut directions of the LiNbO$_3$ substrate. When the direction of each axis is predetermined as shown in FIG. 8, the piezoelectric coefficient $d_{12}'$ has a great influence on the sensitivity of the acceleration sensor when the thickness direction is the X' axis direction, and the longitudinal direction is the Y' direction. When the thickness direction of the substrate is predetermined to be the X' axis direction and the longitudinal direction is the Z' axis direction, piezoelectric coefficient $d_{13}'$ gives a great influence on the sensitivity of the acceleration sensor. When the thickness direction of the substrate is predetermined to be the Y' axis direction and the longitudinal direction is the X' axis direction, piezoelectric coefficient $d_{21}'$ has a great influence on the sensitivity of the acceleration sensor. When the thickness direction of the substrate is predetermined to be the Y' axis direction and the longitudinal direction is the Z' axis direction, piezoelectric coefficient $d_{23}'$ has a great influence on the sensitivity of the acceleration sensor. When the thickness direction of the substrate is predetermined to be the Z' axis direction and the longitudinal direction is the X' axis direction, piezoelectric coefficient $d_{31}'$ has a great influence on the sensitivity of the acceleration sensor. When the thickness direction of the substrate is predetermined to be the Z' axis direction and the longitudinal direction is the Y' axis direction, piezoelectric coefficient $d_{32}'$ has a great influence on the sensitivity of the acceleration sensor.

Figure 9:
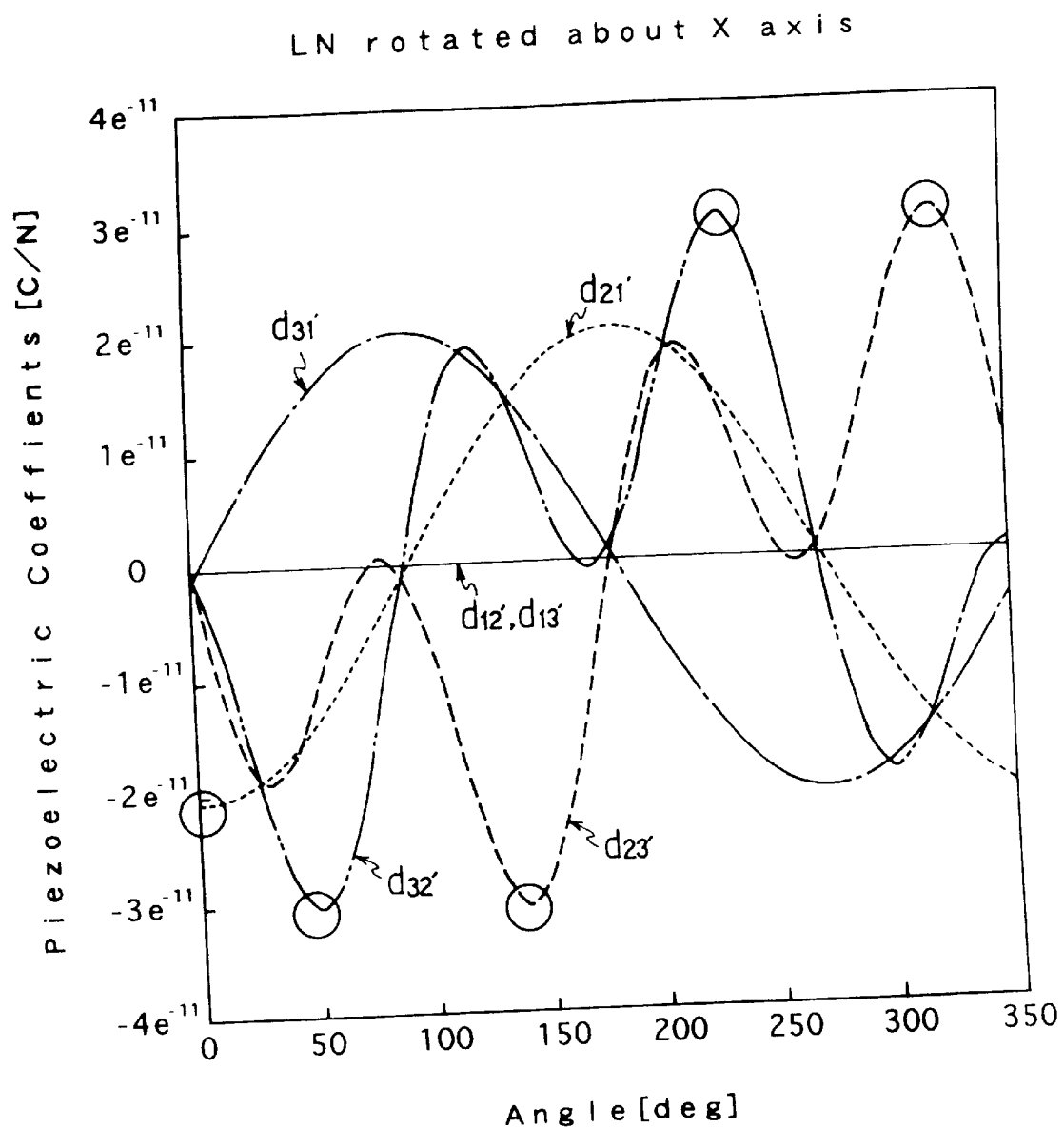
FIG. 9 is a graph showing the relationship between the cut angle of a $LiNbO_3$ substrate and its piezoelectric coefficients.
Figure 10:
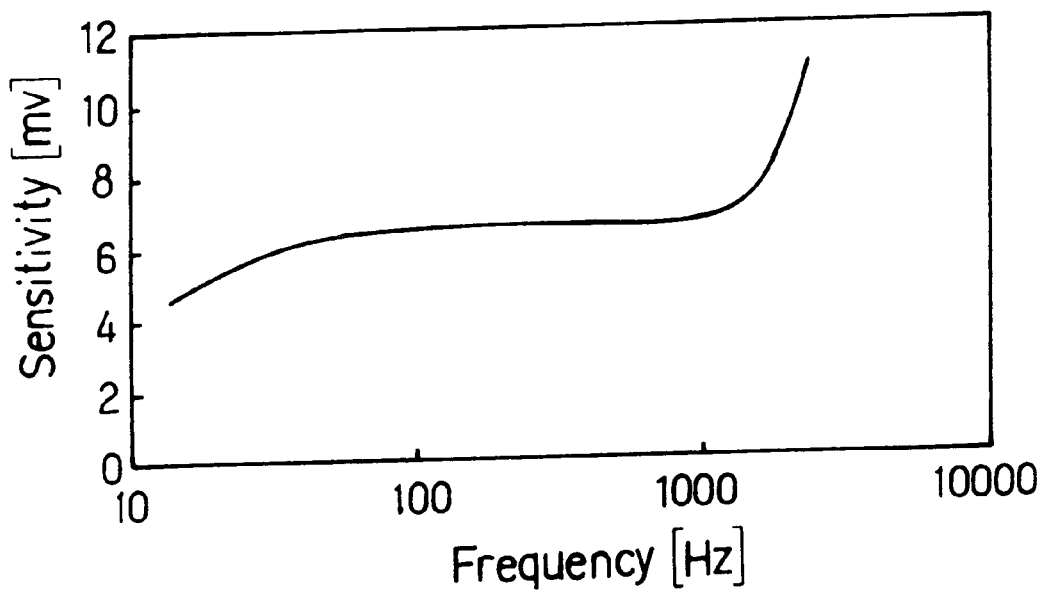
FIG. 10 is a graph showing frequency characteristics of the acceleration sensor of the first embodiment of this invention.

FIG. 9 is a graph showing the relationship between the cut angle of a $LiNbO_3$ substrate and its piezoelectric coefficient. As shown in FIG. 9, the piezoelectric coefficient $d_{23}'$ has its maximum value when the cut angle is 140°. Experimental results for an electromechanical transducer having various cut angles are shown in the following Table 1 and in FIG. 10.

TABLE 1

| Cut angle (°) | | Piezoelectric coefficient $d_{23}'$ (C/N) | Sensitivity (mV/G) |
|---|---|---|---|
| Y-cut 135° | Z' direction | $-2.99 \times 10^{-11}$ | 6.1 |
| Y-cut 135° | X direction | $1.40 \times 10^{-11}$ | 3.7 |
| Y-cut 140° | Z' direction | $-3.06 \times 10^{-11}$ | 6.4 |
| Y-cut 140° | X direction | $1.53 \times 10^{-11}$ | 3.8 |
| Y-cut 165° | Y direction | $1.98 \times 10^{-11}$ | 4.6 |
| Z-cut 0° | X direction | 0.0 | No sensitivity |
| Z-cut 0° | Y direction | 0.0 | No sensitivity |

Figure 11:
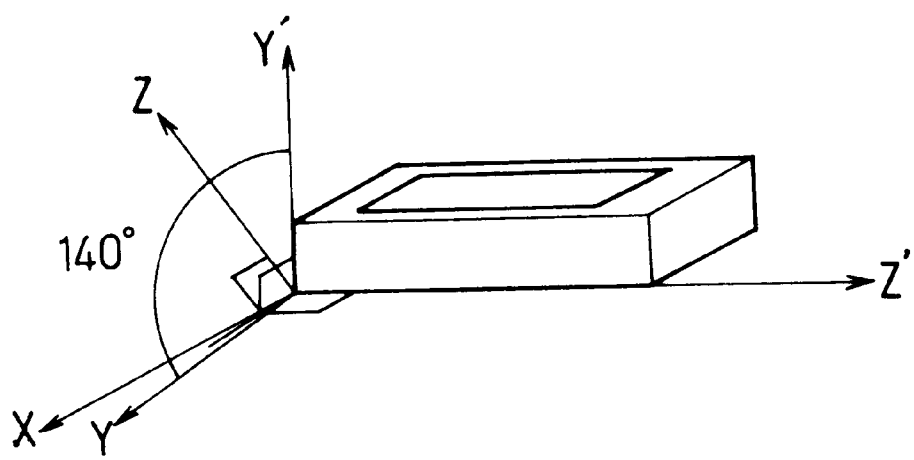
FIG. 11 is a perspective view showing cut angles of the acceleration sensor of the first embodiment of this invention.

As shown in the above Table 1, the electromechanical transducer generated the maximum electric charge when the Y-cut 140° substrate having the biggest piezoelectric coefficient was used and the Z' axis was the longitudinal direction. FIG. 11 shows the influence of the cut angle. As shown in FIG. 11, the best sensitivity was obtained when the Y axis was rotated by 140° about the X angle, an electrode was formed on a face perpendicular to the Y' axis, and the Z' axis was the longitudinal direction.

The crystal structure of $LiNbO_3$ is trigonal 3m class, and has a symmetric structure with the Z axis three times. Thus, there are several cut angles having the same piezoelectric coefficients. For example, the piezoelectric coefficient $d_{32}'$ of cut angles 50° and of 230° are the same as $d_{23}'$ of cut angles of 140° and of 320. This depends on the symmetry of the crystals.

If the cut angle is close to the best cut angle where the sensitivity is the maximum, the piezoelectric coefficient is less influenced by the cut angle, thus substantially the same sensitivity can be obtained even if the cut angle is not optimized precisely. Several problems will be found if the cut angle is optimized precisely. For example, the process should be accurate, and the cost will rise because the processes will be complicated to reduce variation, and the unit price also rises due to bad yield. Though the best cut angle of the piezoelectric coefficient $d_{23}'$ is 140° as shown in FIG. 9, the piezoelectric coefficient is 90–100% of its maximum value when the cut angle is 129–152°, and problems due to sensitivity deterioration do not arise. When the thickness direction of the $LiNbO_3$ substrate is Y' axis and the longitudinal direction is X axis, the sensitivity of the acceleration sensor depends on the piezoelectric coefficient $d_{21}'$. As shown in FIG. 9, the cut angle dependency of the piezoelectric coefficient $d_{21}'$ is smaller than that of $d_{23}'$. In this case, if the cut angle is in the range of ±26°, the piezoelectric coefficients become 90–100% of the maximum value, so problems due to sensitivity deterioration do not arise. Therefore, a highly sensitive acceleration sensor can be produced without precise cut angle, and the process cost can be lowered. If the cut angles of two piezoelectric substrates differ from each other, the electric charge caused by the pyroelectric effect of the piezoelectric element cannot be cancelled out, so the difference of cut angles should be decreased. The range of the cut angle difference between the two piezoelectric substrates composing the electromechanical transducer can be 1° or less, since the piezoelectric coefficients do not greatly depend on the cut angles.

The length, thickness and width of the electromechanical transducer 1 is determined based on the frequency range of the acceleration to be measured. If the frequency of the measured acceleration is close to the resonance frequency of the electromechanical transducer, the sensitivity of the acceleration sensor is improved. When a cantilever structure electromechanical transducer 1 is prepared by directly connecting two $LiNbO_3$ substrates of 50 µm thick and by determining the length from its top to its supporter to be 2 mm, the resonance frequency is 20 kHz. As clear from the measured relationship of sensitivity to acceleration frequency shown in FIG. 10, when the acceleration frequency is 10 kHz or more, the sensitivity is improved since the frequency is close to the resonance frequency of the electromechanical transducer 1. The resonance frequency should be separated sufficiently from the measurement frequency range so that the sensitivity of the acceleration sensor is not greatly influenced by the frequency. For this purpose, for example, the electromechanical transducer 1 should be set so that the resonance frequency becomes twice as the maximum measurement frequency. As mentioned above, the resonance frequency of the electromechanical transducer 1 is determined depending on its length and thickness. In a conventional acceleration sensor using a piezoelectric ceramic, the electromechanical transducer is supported via adhesives. It is difficult to control the amount of the adhesive, and thus the length of the electromechanical transducer varies quite substantially. For example, extra adhesive will make the electromechanical transducer 1 shorter. As a result, in an acceleration sensor using a conventional piezoelectric ceramic, the resonance frequency of the electromechanical transducer varies, and thus several problems are found, such as the sensitivity variation in the high-frequency region. In addition, the frequencies which can be measured will change respectively. In this embodiment, the supporters (4a, 4b) are directly connected to the electromechanical transducer 1, so the length variation of the electromechanical transducer 1 becomes remarkably small. Therefore, the resonance frequency of the electromechanical transducer 1 is extremely small, and thus, the sensitivity in the high-frequency region of the respective acceleration sensor and the measurement frequency range vary much less.

$LiNbO_3$ as a piezoelectric material has a single crystal structure, and thus the variations of its piezoelectric coefficients, dielectric constant, elastic coefficient are very small. In a piezoelectric ceramic, these material constants generally vary by about 20%. In the acceleration sensor produced by directly connecting $LiNbO_3$ substrates, the variations of sensitivity and of resonance frequency were reduced to 5% or less.

Furthermore, the piezoelectric ceramic deteriorates with time, and thus it is unstable. Therefore, in an acceleration sensor using piezoelectric ceramic, the sensitivity changes by 10–15% over time. On the other hand, the acceleration sensor produced by directly connecting $LiNbO_3$ substrates is so stable that it deteriorates 2% at most over time.

In addition to $LiNbO_3$, single crystal piezoelectric materials which can be directly connected are used for the piezoelectric substrates (2a, 2b), for example, lithium tantalate ($LiTaO_3$), quartz, and Langasite-type piezoelectric crystals. Langasite-type piezoelectric crystals include $La_3Ga_5SiO_{14}$, $La_3Ga_{5.5}Nb_{0.5}O_{14}$, and $La_3Ga_{5.5}Ta_{0.5}O_{14}$. The crystal structure of $LiTaO_3$ is of a trigonal system 3m class like $LiNbO_3$, and the best cut angle is identical to that of $LiNbO_3$. The crystal structures of quartz and Langasite-type piezoelectric crystals are of trigonal system 32 classes.

Figure 12:
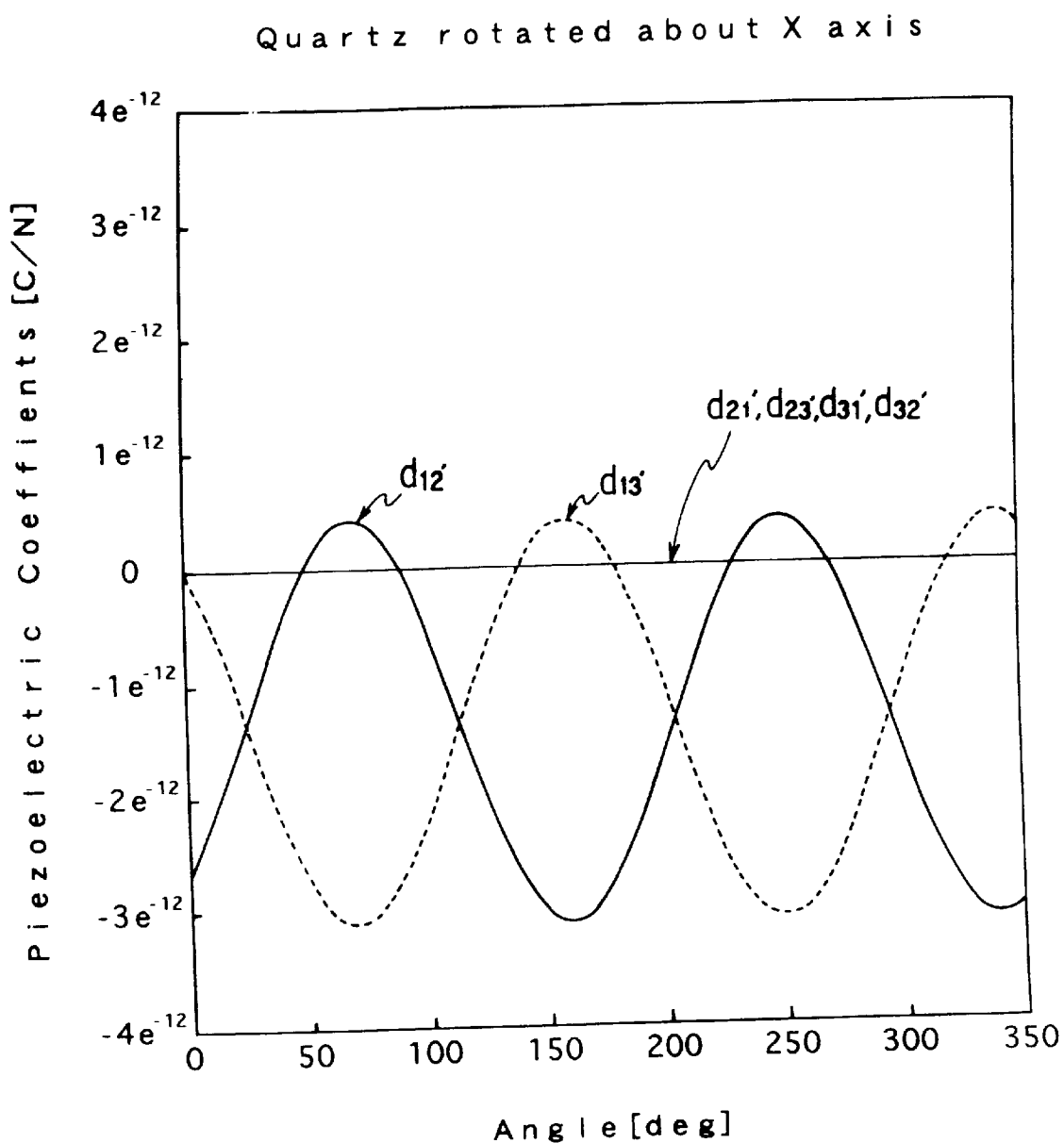
FIG. 12 is a graph showing the relationship between the cut angles of a quartz substrate and its piezoelectric coefficients.
Figure 13:
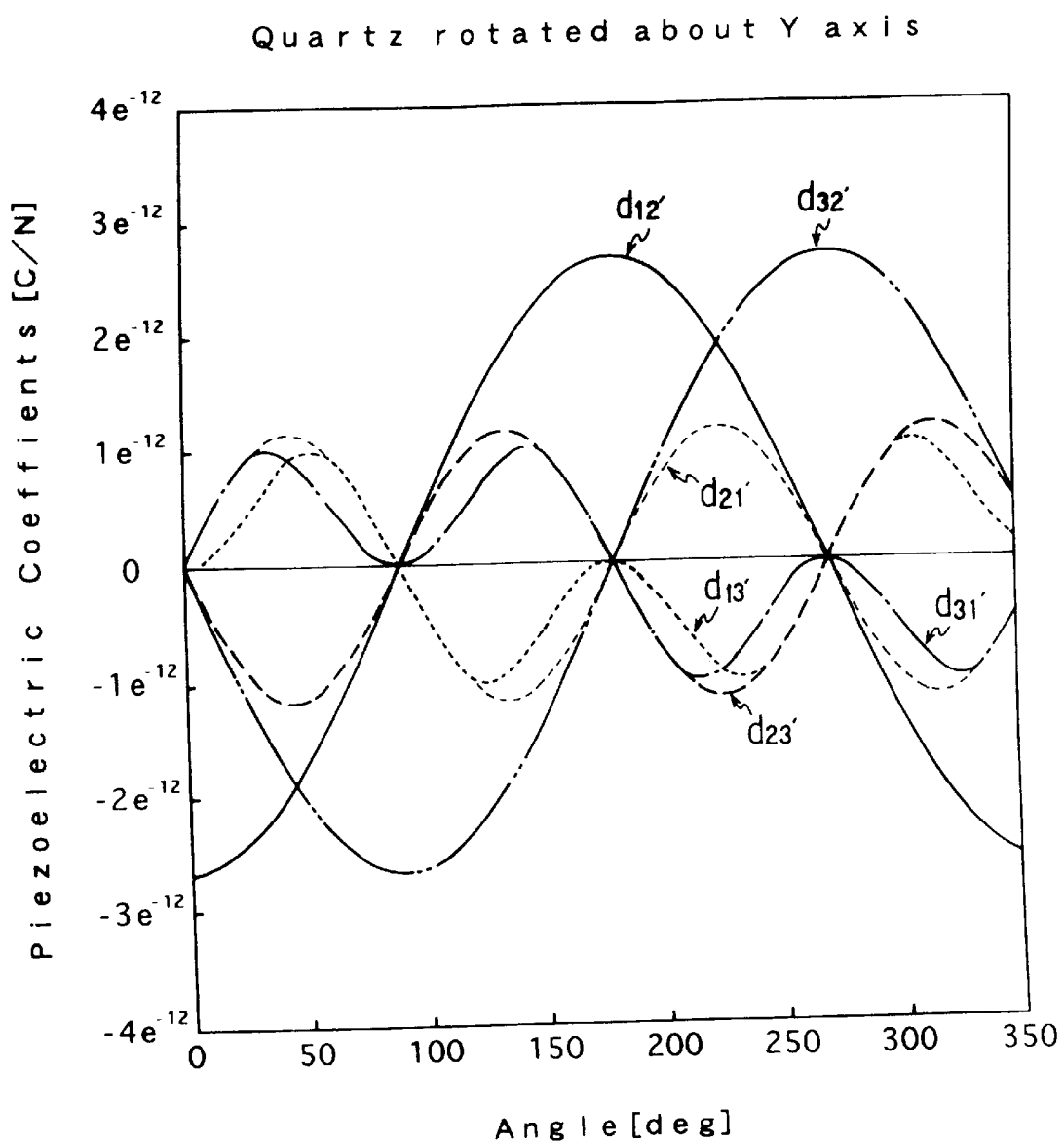
FIG. 13 is a graph showing the relationship between the cut angles of a quartz substrate and its piezoelectric coefficients.
Figure 14:
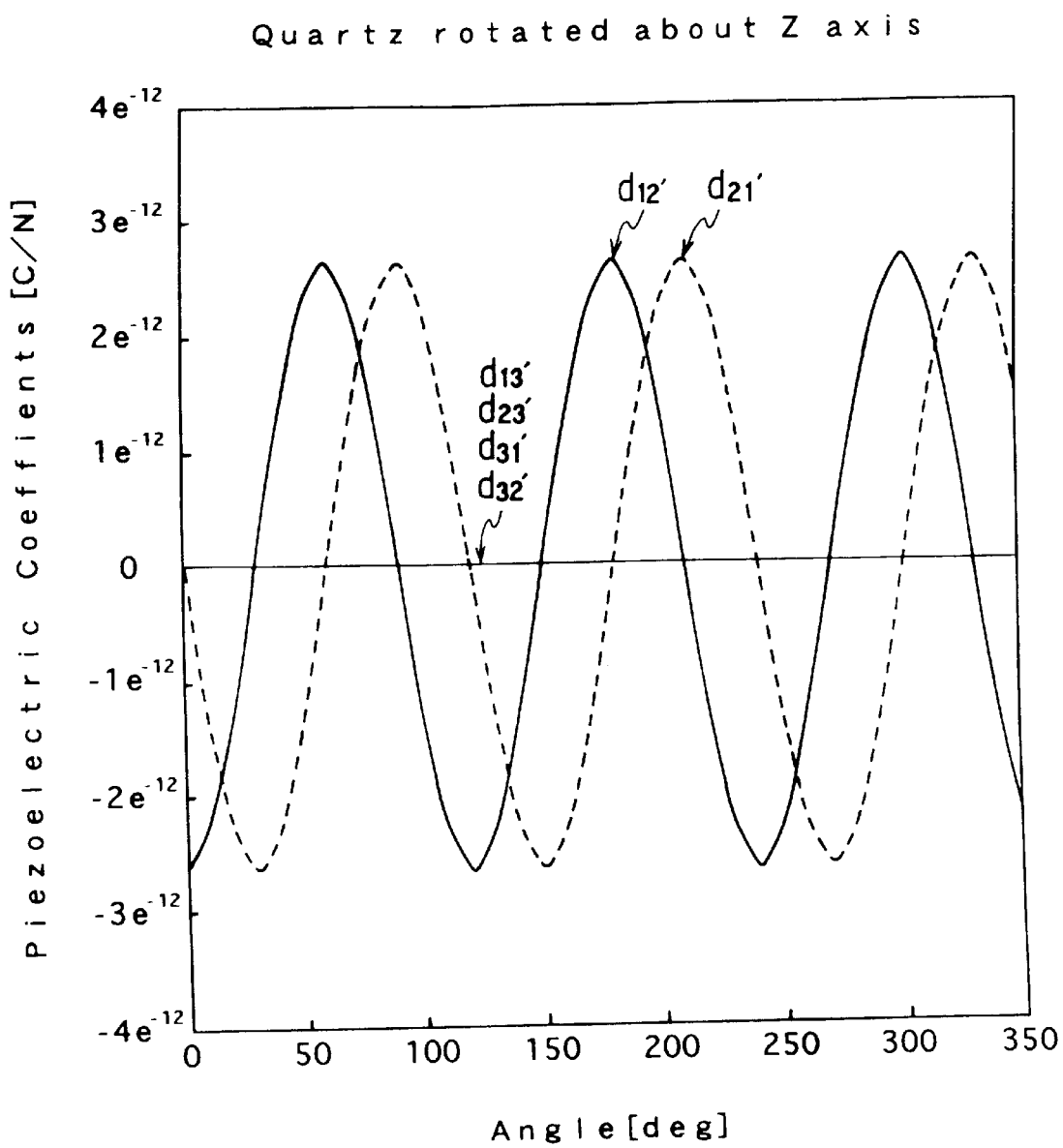
FIG. 14 is a graph showing the relationship between the cut angles of a quartz substrate and its piezoelectric coefficients.

FIGS. 12–14 show the relationship between the cut angle of a quartz substrate having 32 classes crystal structure and the piezoelectric coefficients. FIG. 12 shows the relationship between the cut angle rotated about the X axis and the piezoelectric coefficients. FIG. 13 shows the relationship between the cut angle rotated about the Y axis and the piezoelectric coefficients. FIG. 14 shows the relationship between the cut angle rotated about the Z axis and the piezoelectric coefficients. The relationship between the cut angle of Langasite-type piezoelectric crystal substrates and piezoelectric coefficients is same as this.

Table 2 shows the best cut angles of single crystal piezoelectric materials of 32 classes crystal structures, and those of single crystal piezoelectric materials of 3m classes structures. The best cut angles are obtained from FIGS. 12–14.

TABLE 2

| Crystal structure | Material | Best cut angle (Eulerian angle) | Piezoelectric constant having polar value |
| --- | --- | --- | --- |
| 3m trigonal system | Lithium niobate | 140,0,0 | $d_{23}'$ |
|  | Lithium tantalate | 0,0,0 | $d_{21}'$ |
| 32 trigonal system | Quartz | 70,0,0 | $d_{13}'$ |
|  | Langasite-type piezoelectric crystals | 0,0,0<br>0,0,90 | $d_{12}'$<br>$d_{21}'$ |

Note: The cut angles rotated about the Z axis by 120° and those rotated about the X axis and Y axis by 180° are included.

In Table 2, the three numerals of Eulerian angles indicate rotation angles about the X, Y, and Z axes respectively. The maximum piezoelectric coefficients are also indicated in Table 2. When a piezoelectric material having 32 classes crystal structure is rotated by 70° about the X axis, the maximum piezoelectric coefficient is $d_{13}'$. It is clear from this fact that the best sensitivity will be obtained when a piezoelectric material having 32 classes crystal structure is rotated by 70° about the X axis, the piezoelectric substrate is cut out perpendicularly to the rotated X' axis (=X axis) direction, and the longitudinal direction of the piezoelectric substrate is set in the Z' axis direction. When the Eulerian angle is (0, 0, 0), the maximum piezoelectric coefficient is $d_{12}'$. In other words, the sensitivity is the best if the piezoelectric substrate is cut out perpendicular to the rotated X' axis (=X axis) direction and the longitudinal direction of the piezoelectric substrate is set in the Y' axis direction. When the Eulerian angle is (0, 0, 90), the maximum piezoelectric coefficient is $d_{21}'$. In other words, the sensitivity is the best if the piezoelectric substrate is cut out perpendicular to the rotated Y' axis (=Y axis) direction and the longitudinal direction of the piezoelectric substrate is set in the X' axis direction.

In a piezoelectric substrate having 32 classes crystal structure (e.g. quartz, Langasite-type piezoelectric crystals), the piezoelectric coefficients become 90–100% of the maximum value when $d_{13}'$ is from +52° to +86°, $d_{12}'$ is within ±26, or $d_{32}'$ is from +52° to +68°, so problems due to sensitivity deterioration will not arise. Therefore, the process cost can be lowered since a highly sensitive acceleration sensor can be produced even if the cut angle is not precise.

In this embodiment, the electromechanical transducer 1 is prepared by a strong direct connection of the piezoelectric substrates (2a, 2b) without using adhesive layers. Therefore, a highly sensitive acceleration sensor can be obtained without characteristic variation or decrease of vibration. In addition, the electromechanical transducer 1 can be located precisely since the electromechanical transducer 1 is directly connected to the supporters (4a, 4b) without using adhesives. As a result, a small acceleration sensor can be obtained. The length and supporting conditions of the cantilever do not vary, and thus the characteristics of the acceleration sensor are remarkably stable. The electromechanical transducer 1 can be located precisely since the electromechanical transducer 1 is directly connected to the supporters (4a, 4b) without using adhesives, so acceleration is transferred to the electromechanical transducer 1 without loss.

In this embodiment, chromium-gold is used for the electrodes (3a, 3b). Gold, chromium, silver, and alloy also can be used as the electrode material.

In this embodiment, $LiNbO_3$ is used for the packages (10a, 10b). $LiTaO_3$, quartz, glass, plastics and ceramics like alumina also can be used for the material.

In this embodiment, the electromechanical transducer 1 has a cantilever structure. It is also possible that the electromechanical transducer 1 can be made to have a both-end clamped structure by directly connecting its ends to supporters. The center of the electromechanical transducer 1 also can be directly connected to the supporters.

The Second Embodiment

Figure 15:
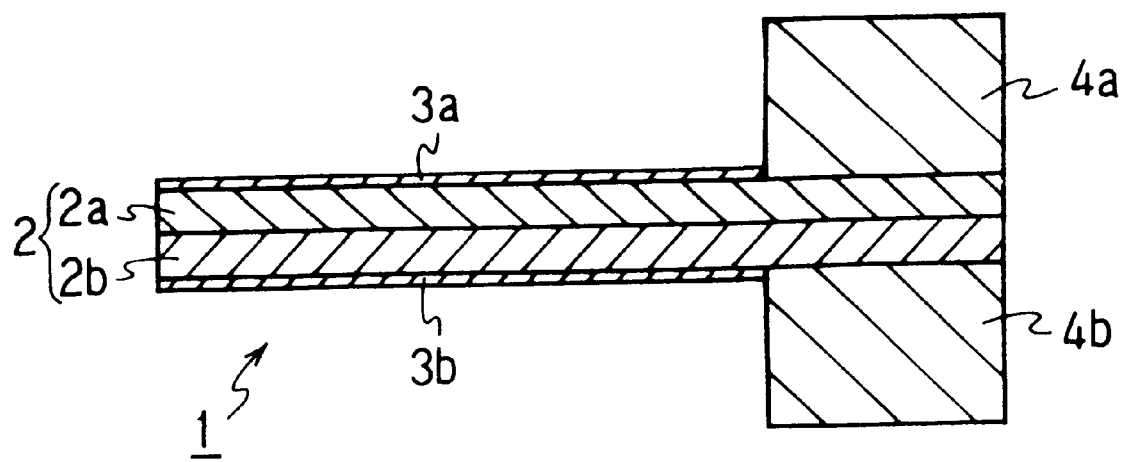
FIG. 15 is a cross-sectional view showing an electromechanical transducer used for an acceleration sensor of the second embodiment of this invention.

FIG. 15 is a cross-sectional view of an electromechanical transducer used for an acceleration sensor of the second embodiment of this invention. As shown in FIG. 15, a piezoelectric element 2 is formed by directly connecting two opposite main faces of piezoelectric substrates (2a, 2b) which comprise lithium niobate ($LiNbO_3$). The rectangular piezoelectric substrates are 50 μm thick, 0.5 mm wide, 2 mm long. The piezoelectric substrates (2a, 2b) are connected so that their polarization axes are directed oppositely. One end of the piezoelectric element 2 is fixed in a condition sandwiched by supporters (4a, 4b) comprising $LiNbO_3$. The piezoelectric element 2 is directly connected to the supporters (4a, 4b). The opposite main faces of the piezoelectric element 2 have portions which are not sandwiched by the supporters. Chromium-gold electrodes (3a, 3b) of 0.2 μm thick are formed at these non-sandwiched portions. Therefore, a cantilever structure bimorph structure electromechanical transducer 1 is formed.

Figure 16:
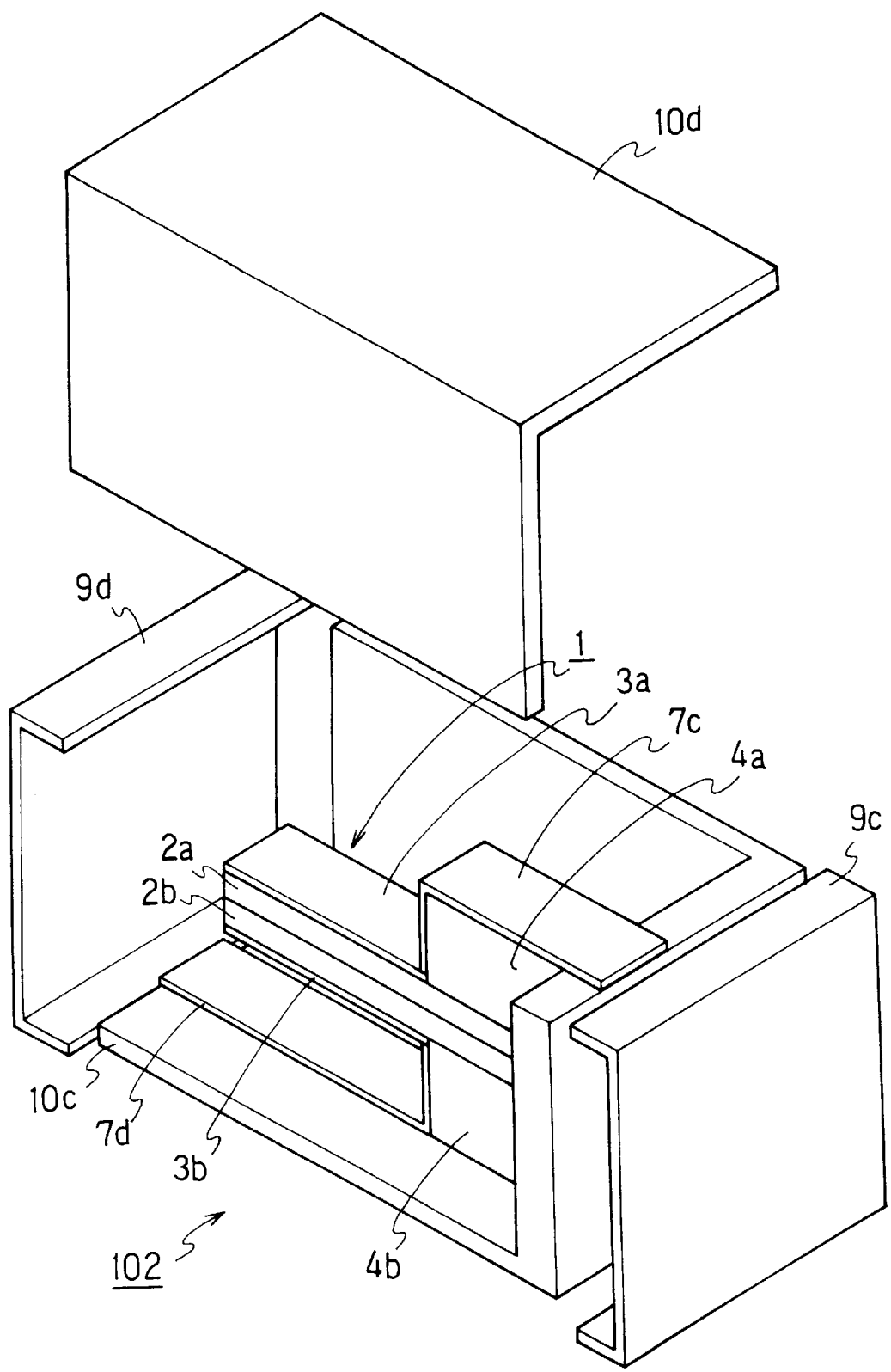
FIG. 16 is an exploded perspective view of an example of an acceleration sensor of the second embodiment of this invention.
Figure 17:
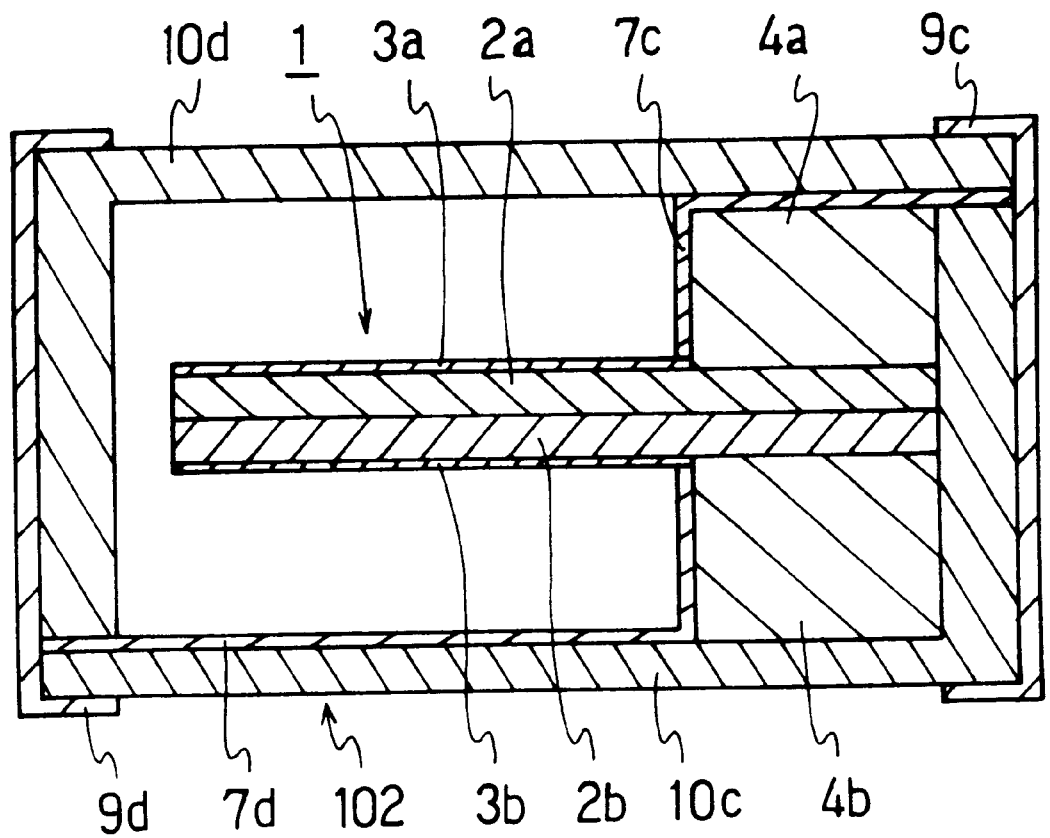
FIG. 17 is a cross-sectional view of an example of an acceleration sensor of the second embodiment of this invention.

FIG. 16 is an exploded perspective view of an example of an acceleration sensor of the second embodiment of this invention, and FIG. 17 is a cross-sectional view of FIG. 16. As shown in FIGS. 16 and 17, the cantilever structure electromechanical transducer 1 of FIG. 15 is set in a package 10c comprising $LiNbO_3$ and the supporters (4a, 4b) are directly connected to the inside of the other end face of the package 10c. The upper face, one end face, and one side of the package 10c are open. The supporters (4a, 4b) and the package 10c also can be directly connected via a buffer layer comprising silicon oxide thin film. Ends of conductive layers (7c, 7d) are connected to the electrodes (3a, 3b) along the supporters (4a, 4b) and the package 10c. The other ends of the conductive layers (7c, 7d) are exposed at the end of the package 10c. A package 10d having the same shape as package 10c and comprising $LiNbO_3$ is connected to the package 10c. Outer electrodes (9c, 9d) comprising nickel are formed on the outsides of the packages (10c, 10d). The outer electrodes (9c, 9d) are electrically connected to the conductive layers (7c, 7d) respectively. In other words, the electrodes (3a. 3b) are electrically connected to the outer electrodes (9c, 9d) respectively via the conductive layers (7c, 7d). Therefore, the electric charge generated in the electromechanical transducer 1 can conduct out. An acceleration sensor 102 is formed as mentioned above.

In the acceleration sensor 102 shown in FIG. 17, the electromechanical transducer 1 vibrates vertically and flexible vibration occurs if acceleration is applied vertically. Once flexible vibration occurs, certain faces of the piezoelectric substrates (2a, 2b) are stretch-distorted while the other faces are shrink-distorted. The piezoelectric substrates (2a, 2b) are connected so that the directions of the polarization axes are opposed. Namely, electromotive force is generated on the piezoelectric substrates (2a, 2b) in the same direction. As a result, signals which reflect the acceleration can be obtained from the electrodes (3a, 3b) formed on the both faces of the electromechanical transducer 1.

Figure 18:
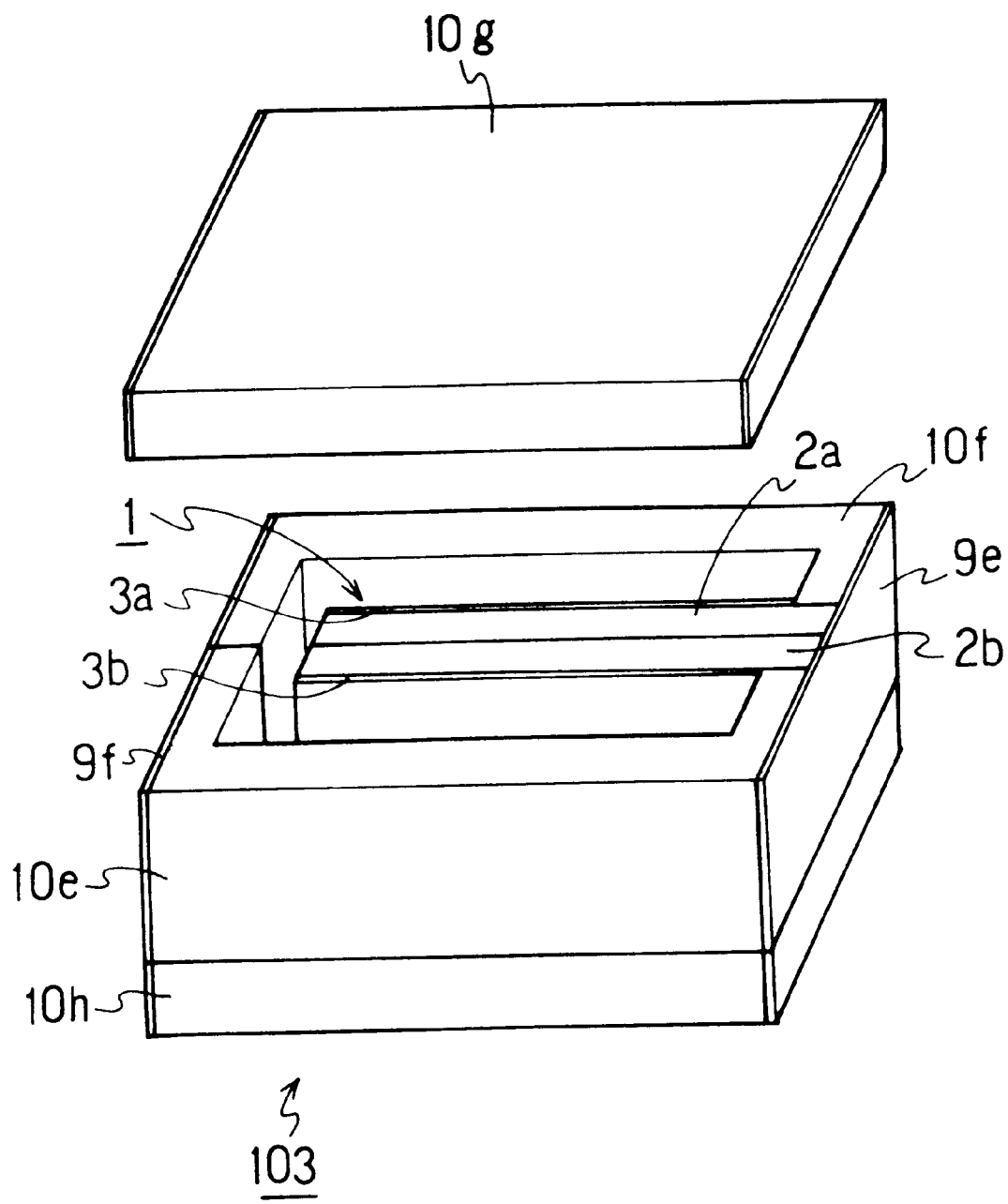
FIG. 18 is an exploded perspective view of another example of an acceleration sensor of the second embodiment of this invention.

FIG. 18 is an exploded perspective view of another example of an acceleration sensor of the second embodiment of this invention. As shown in FIG. 18, a piezoelectric element 2 is formed by directly connecting opposite main faces of piezoelectric substrates (2a, 2b) which comprise lithium niobate (LiNbO$_3$). The rectangular piezoelectric substrates are 50 μm thick, 0.5 mm wide, 2 mm long. The piezoelectric substrates (2a, 2b) are connected so that their polarization axes are directed oppositely. Chromium-gold electrodes (3a, 3b) of 0.2 μm thick are formed on the two opposite main faces. Therefore, a cantilever structure bimorph electromechanical transducer 1 is formed. One end of the electromechanical transducer 1 is sandwiched between packages (10e, 10f) comprising LiNbO$_3$ which are opened vertically and separated into two parts. And thus, the electromechanical transducer 1 is supported. The packages (10e, 10f) are directly connected to the electromechanical transducer 1, and the same packages are directly connected to each other. The direct connection of the packages to the electromechanical transducer, or the direct connection between the packages can be conducted via buffer layers comprising a thin silicon oxide layer. Packages (10g, 10h) are fixed with adhesive to the upper and lower faces of the packages (10e. 10f). As a result, the electromechanical transducer 1 is sealed in the package. Outer electrodes (9e, 9f) comprising nickel are formed on the end faces of the packages, and this outer electrodes (9e, 9f) are electrically connected to the electrodes (3a, 3b) via conductive layers (not shown). Therefore, electric charge generated in the electromechanical transducer 1 can conduct out. Depressions are formed inside the packages (10g, 10h) so that the electromechanical transducer is not contacted when the electromechanical transducer 1 bends. An acceleration sensor 103 has the configuration mentioned above.

The length, thickness and width of the electromechanical transducer 1 is determined based on the frequency range of the acceleration to be measured. As the frequency of the measured acceleration gets close to the resonance frequency of the electromechanical transducer 1, the sensitivity of the acceleration sensor is improved. The resonance frequency should be separated sufficiently from the measurement frequency range so that the sensitivity of the acceleration sensor is not greatly influenced by the frequency. For this purpose, for example, the electromechanical transducer 1 should be set so that the resonance frequency is twice the maximum measurement frequency.

LiNbO$_3$ (a piezoelectric material) has a single crystal structure, and thus the variations of its piezoelectric coefficients, dielectric constant, elastic coefficient are very small. In a piezoelectric ceramic, these material constants generally vary by about 20%. In the acceleration sensor produced by directly connecting LiNbO$_3$ substrates, the variations of sensitivity and of resonance frequency were reduced to 5% or less.

Furthermore, the piezoelectric ceramic deteriorates over time, and thus it is unstable. Therefore, in an acceleration sensor using a piezoelectric ceramic, the sensitivity changes by 10–15% over time. On the other hand, the acceleration sensor produced by directly connecting LiNbO$_3$ substrates is so stable that it deteriorates 2% at most over time.

In this embodiment, the electromechanical transducer 1 is prepared by a strong direct connection of the piezoelectric substrates (2a, 2b) without using adhesive layers. Therefore, a highly sensitive acceleration sensor can be obtained without characteristic variation or decrease of vibration. In addition, the electromechanical transducer 1 can be located precisely since the electromechanical transducer 1 is directly connected to the supporters (4a, 4b) without using adhesives. As a result, a small acceleration sensor can be obtained. The length and supporting conditions of the cantilever do not vary, and thus the characteristics of the acceleration sensor are remarkably stable. The electromechanical transducer 1 can be located precisely since the electromechanical transducer 1 is directly connected to the supporters (4a, 4b) without using adhesives, so acceleration is transferred to the electromechanical transducer 1 without loss. In addition to that, the supporters (4a, 4b) are directly connected to the packages without using adhesives. As a result, the supporters (4a, 4b) are firmly connected to the packages to which acceleration from the mounting face is directly transferred, and thus acceleration can be transferred without loss to the electromechanical transducer 1.

In this embodiment, LiNbO$_3$ is used for the piezoelectric substrates (2a, 2b). LiTaO$_3$ and quartz also can be used for the material.

In this embodiment, gold, chromium, silver, or alloy also can be used for the electrodes (3a, 3b), in addition to chromium-gold.

In this embodiment, glass, ceramics, or resin also can be used for the packages, in addition to LiNbO$_3$.

In this embodiment, direct connection is used for fixing of the supporters (4a, 4b) of the electromechanical transducer 1 to inside the packages or for fixing the packages. Fixing with adhesives may also be useful.

In this embodiment, the electromechanical transducer 1 has a cantilever structure. It is also possible that the electromechanical transducer 1 can be made to have a both-end clamped structure by directly connecting its ends to supporters. The center of the electromechanical transducer 1 also can be directly connected to the supporters.

The Third Embodiment

The cantilever structure acceleration sensor shown in FIGS. 16-18 and method for producing the same will be explained below.

FIGS. 19(a)–19(c) and FIGS. 20(a)–19(c) are flow charts showing a method for producing an acceleration sensor of the third embodiment of this invention.

Figure 19A:
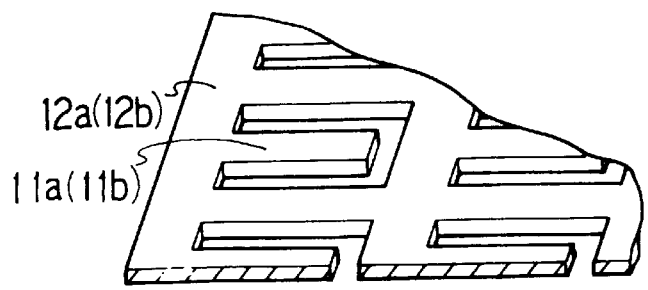
FIGS. 19(a)–19(c) are flow charts showing a method for producing an acceleration sensor of the third embodiment of this invention.

In the first step shown in FIG. 19(a), cantilevers (11a, 11b) were formed by sandblasting where LiNbO$_3$ substrates were used for piezoelectric substrates (12a, 12b) and photoresist patterns are masking reagents.

Figure 19B:
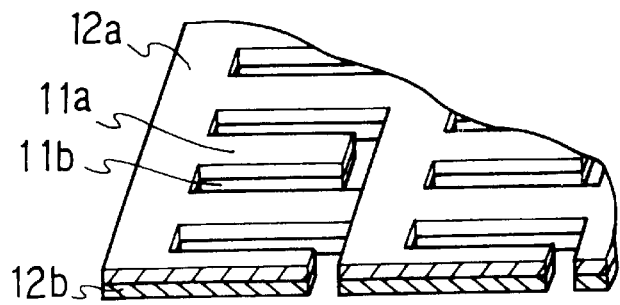

Next, as shown in FIG. 19(b), the piezoelectric substrate (12a) formed with the cantilever (11a) and piezoelectric substrate (12b) formed with the cantilever (11b) are directly connected to each other. The direct connection was conducted by connecting the hydrophilic-treated two piezoelectric substrates (12a, 12b) so that the polarization axes are opposite, and heat-treating the substrates. The direct connection can also be conducted via a buffer layer comprising silicon oxide layers.

Figure 19C:
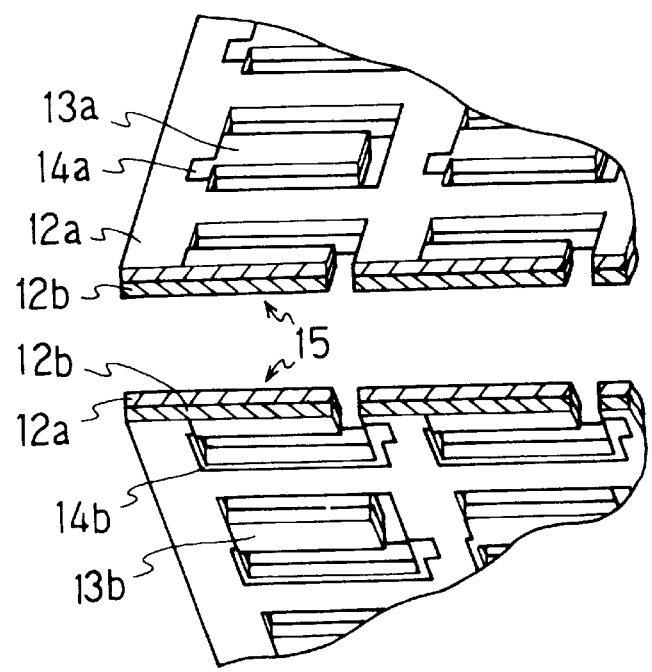

In the next step shown in FIG. 19(c), electrodes (13a, 13b) were formed on the both sides of the cantilever by evaporating chromium-gold, using vacuum evaporation. Therefore, a cantilever structure bimorph electromechanical transducer 15 was obtained. The electromechanical transducer 15 is supported with the apertures of the piezoelectric substrates as supporters. A conductive layer 14a was formed on the piezoelectric substrate 12a. The electrode 13a and the conductive layer 14a were on the same side and they conduct to each other. This conductive layer 14a is used to conduct electric charge generated on the electrode 13a to the outer electrode 20a (see FIGS. 20(b) and (c)). A conductive layer 14b was formed on the piezoelectric substrate 12b on which the electrode 13b was formed to conduct to the opposite side (right hand of the figure) of the aperture on the piezoelectric substrate 12b and the cantilever. The producing processes can be simplified by simultaneously forming the conductive layer 14a or 14b with the electrode 13a, 13b.

Figure 20A:
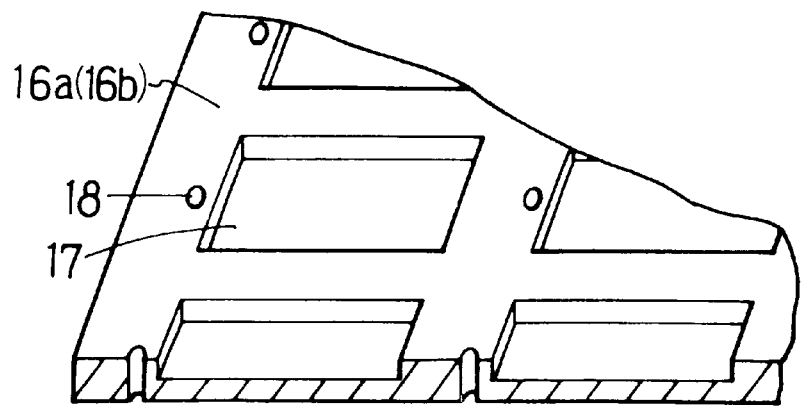
FIGS. 20(a)–20(c) are flow charts showing another method for producing an acceleration sensor of the third embodiment of this invention.

Next, packages (16a, 16b) were formed by forming a concavity 17 on another LiNbO$_3$ substrate by sandblasting, where photoresist patterns were used for masking reagents (see FIG. 20(a)). Simultaneously, a penetrating hole 18 was formed in the packages (16a, 16b) in order to be electrically connected to the conductive layers (14a, 14b) on the piezoelectric substrates (12a, 12b).

Figure 20B:
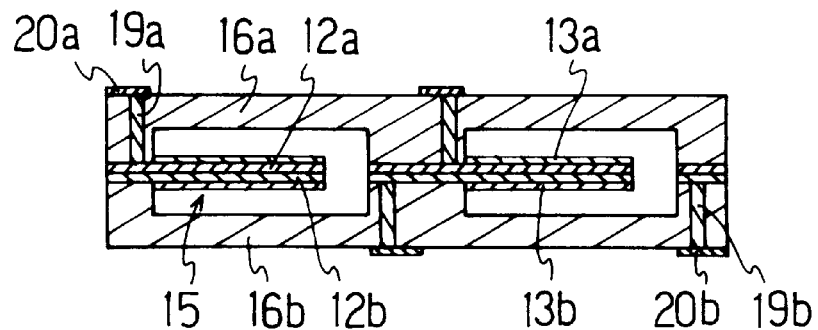

As shown in FIG. 20(b), the piezoelectric substrates (12a, 12b) formed with the electromechanical transducer 15 and the packages (16a, 16b) were connected to each other by direct connection. As a result, the electromechanical transducer 15 was sealed inside the packages (16a, 16b). The direct connection between the piezoelectric substrates (12a, 12b) and the packages (16a, 16b) also can be carried out via a buffer layer comprising silicon oxide thin layer. The cantilever was pattern-formed simultaneously with the supporters from the LiNbO$_3$ substrate, and thus the supporters also might bend. Actually, however, the cantilever was still supported firmly by the packages (16a, 16b) and another LiNbO$_3$ substrate which functioned as the supporters. Conductive layers (chromium-gold) (14a, 14b) were formed on the connecting portions between the piezoelectric substrates of LiNbO$_3$ (12a, 12b) and the packages of LiNbO$_3$ (16a, 16b). Therefore, it was difficult to directly connect the piezoelectric substrates to the packages. However, the connection can be strong if the connecting area between the piezoelectric substrates and the packages are sufficient in size compared to the size of the conductive layers (14a, 14b). Then, through-fall conductive portions (19a, 19b) were formed by pouring conductive paste into the penetrating hole 18 on the packages (16a, 16b) in order to electrically connect to the conductive layers (14a, 14b), and firing the structure thus formed. Moreover, silver-palladium was printed on the upper faces of the packages (16a, 16b) in order to be conductive to the through-fall portions (19a, 19b), and thus outer electrodes (20a, 20b) were formed. As a result, the electrodes (13a, 13b) on the electromechanical transducer 15 and the outer electrodes (20a, 20b) were electrically connected to each other.

Figure 20C:
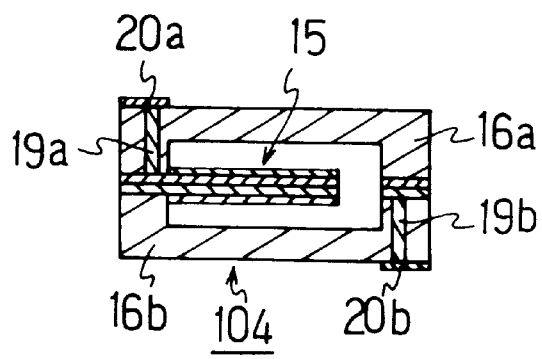

As shown in FIG. 20(c), the substrate was cut off into acceleration sensors 104 by using a dicing saw. The electromechanical transducer 15 has a cantilever, and it is firmly connected to the packages (16a, 16b).

In the acceleration sensor 104 shown in FIG. 20(c), the electromechanical transducer 15 vibrates vertically and flexible vibration occurs if acceleration is applied vertically. Once flexible vibration occurs, certain faces of the piezoelectric substrates (12a, 12b) are stretch-distorted while the other faces are shrink-distorted. The piezoelectric substrates (12a, 12b) are connected to each other so that the direction polarization axes are opposed. Namely, electromotive force is generated on the piezoelectric substrates (12a, 12b) in the same direction. As a result, signals which reflect the acceleration can be obtained from the electrodes (13a, 13b) formed on the both faces of the electromechanical transducer 15.

The length, thickness and width of the electromechanical transducer 15 is determined based on the frequency range of the acceleration to be measured. As the frequency of the measured acceleration becomes close to the resonance frequency of the electromechanical transducer 15, the sensitivity of the acceleration sensor 104 is improved. The resonance frequency should be separated sufficiently from the measurement frequency range so that the sensitivity of the acceleration sensor 104 is not greatly influenced by the frequency. For this purpose, for example, the electromechanical transducer 15 should be set so that the resonance frequency is twice the maximum measurement frequency.

In this embodiment, the electromechanical transducer 15 is prepared by a strong direct connection of the piezoelectric substrates (12a, 12b) without using adhesive layers such as adhesives. Therefore, a highly sensitive acceleration sensor 104 can be obtained without characteristic variation or decrease of vibration. The shape variation of the electromechanical transducer 15 can be controlled since the electromechanical transducer 15 is pattern-formed from a piezoelectric substrate. In addition, the supporting condition of the electromechanical transducer 15 is comparatively stable since the electromechanical transducer 15 and the supporters are formed simultaneously. Thus, the cantilever does not greatly vary in length and the characteristics of the acceleration sensor are remarkably stable. The materials of the electromechanical transducer 15, supporters and the packages (16a, 16b) are identical, thus, the influences of temperature, including distortion, can be reduced. Therefore, a small acceleration sensor excellent in stability can be provided. The acceleration sensor is also superior in quantity production since numbers of acceleration sensors are produced simultaneously from a substrate.

In this embodiment, the material for the piezoelectric substrates (12a, 12b) is not limited to LiNbO$_3$, but other materials like LiTaO$_3$ and quartz can also be used.

In this embodiment, the material for packages (16a, 16b) is not limited to LiNbO$_3$, but other materials like LiTaO$_3$, quartz, silicon, and glass can also be used. It is preferable that the material is identical to that of the piezoelectric substrates (12a, 12b) composing the electromechanical transducer 15. It is further preferable that the material has a coefficient of thermal expansion similar to that of the piezoelectric substrates (12a, 12b) composing the electromechanical transducer 15.

In this embodiment, the material of the electrodes (13a, 13b) is not limited to chromium-gold, but other materials like gold, chromium, silver and alloy can also be used.

In this embodiment, the material for the through-fall conductive portions (19a, 19b) is not limited to conductive paste, but other materials like solder and silver solder can also be used.

In this embodiment, a bimorph electromechanical transducer 15 is produced by forming cantilevers (11a, 11b) on the piezoelectric substrates (12a, 12b) and then directly connecting these parts. The order, however is not limited to this. It is also possible that the cantilevers (11a, 11b) are formed after the two piezoelectric substrates (12a, 12b) are directly connected.

In this embodiment, the electrodes (13a, 13b) are formed after the formation of the cantilevers (11a, 11b). The order, however, is not limited to this. It is also possible to form the cantilevers (11a, 11b) after the electrodes (13a, 14b) are formed.

In this embodiment, sandblasting is used for processing the cantilevers (11a, 11b) on the piezoelectric substrates (12a, 12b), the concavity 17 and the penetrating hole 18 on the packages (16a, 16b). The method, however, is not limited to sandblasting. Other methods like dry etching, wet etching, razor processing, ion beam processing, dicing, mechanical processing including wire saw cutting, water jet processing and plasma processing, can also be used.

The method for forming electrodes (13a, 13b) is not limited to vacuum evaporation, but other methods like sputtering, vapor-phase film forming methods including chemical vapor deposit (CVD), plating and printing may be used.

Though in this embodiment the outer electrodes (20a, 20b) are formed on the upper face of the packages (16a, 16b), the electrodes can be provided on the sides of the packages or extending from the side to the top of the packages.

The method for connecting the conductive layers (14a, 14b) to the outer electrodes (20a, 20b) is not limited to providing the penetrating hole 18 on the packages (16a, 16b), but it is also possible to cut the packages (16a, 16b) partially for the same purpose.

In case the piezoelectric substrates of LiNbO$_3$ (12a, 12b) are not connected strongly enough to the packages of LiNbO$_3$ (16a, 16b) due to the existence of the conductive layers (14a, 14b), the connection strength can be improved by forming a buffer layer of silicon oxide film on the connecting face and carrying out connection via the buffer layer.

The Fourth Embodiment

Figure 21:
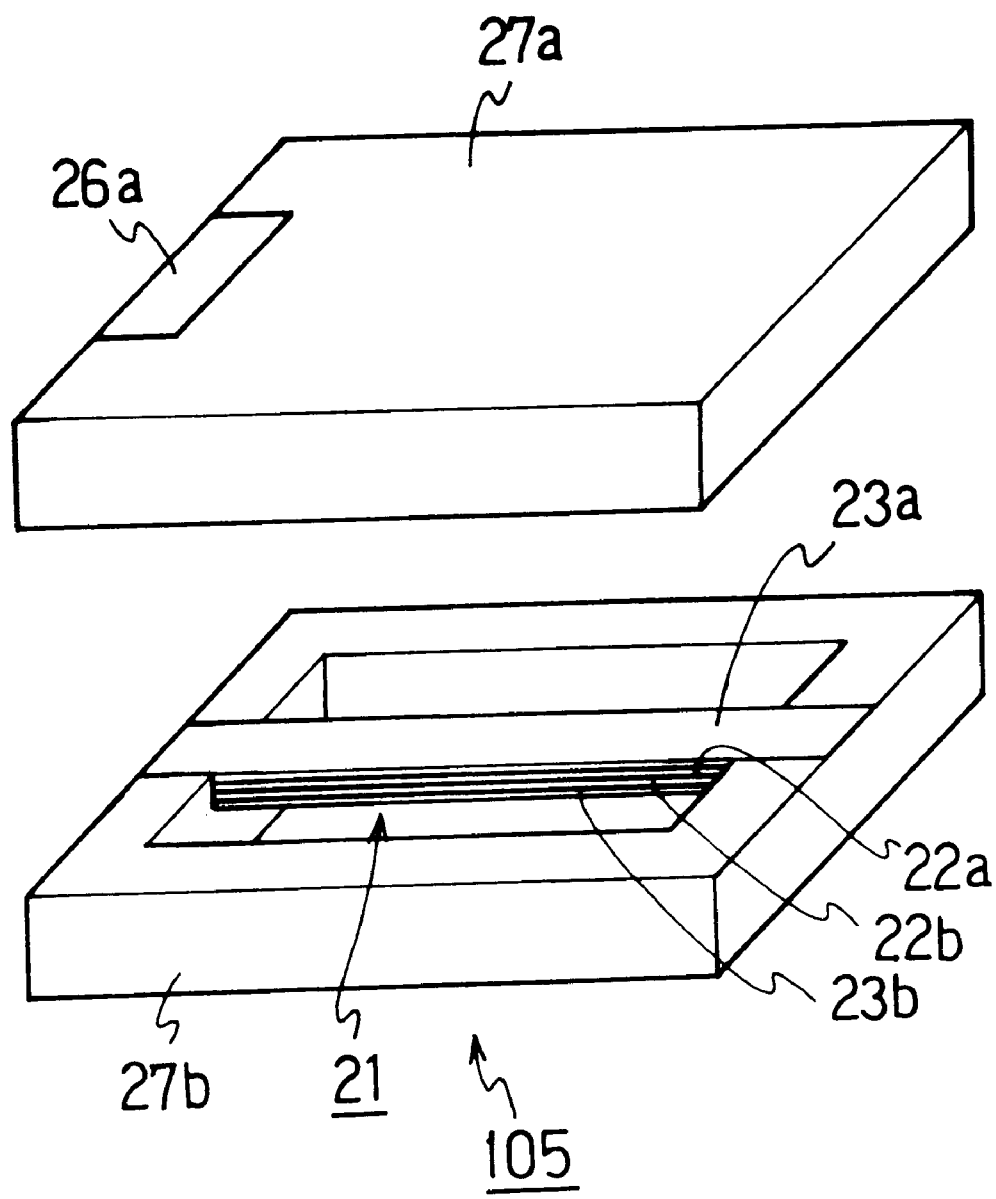
FIG. 21 is an exploded perspective view of an example of an acceleration sensor of the fourth embodiment of this invention.

FIG. 21 is an exploded perspective view of an example of an acceleration sensor of the fourth embodiment of this invention. As shown in FIG. 21, a bimorph electromechanical transducer 21 is connected to a package 27b comprising LiNbO$_3$, and the both ends of the electromechanical transducer are supported (both ends clamped structure). The bimorph structure electromechanical transducer 21 is produced by directly connecting the piezoelectric substrates of LiNbO$_3$ (22a, 22b) to each other. Another package 27a comprising LiNbO$_3$ is directly connected to the package 27b. The direct connection between the packages (27a, 27b) can also be carried out via a buffer layer comprising, for example, a thin silicon oxide film. Outer electrodes (26a, 26b) are respectively connected (26b is not shown) to the outside of the packages (27a, 27b). These outer electrodes (26a, 26b) are electrically connected to the electrodes (23a, 23b) of the electromechanical transducer 21. Therefore, the electric charge generated in the electrodes (23a, 23b) on the electromechanical transducer 21 can conduct out. An acceleration sensor 105 has the configuration mentioned above.

Figure 22:
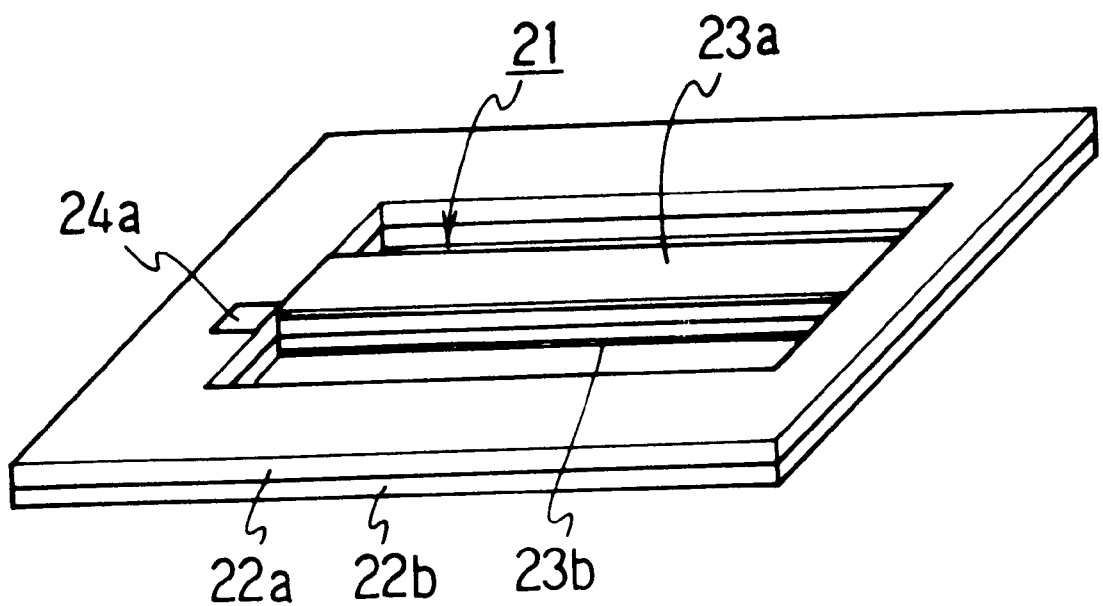
FIG. 22 is an exploded perspective view of another example of an acceleration sensor of the fourth embodiment of this invention.

The both ends clamped structure acceleration sensor 105 can be produced by the same method as the third embodiment. As shown in FIG. 22, a bimorph electromechanical element is produced by forming a both ends clamped structure on the two piezoelectric substrates (22a, 22b) and directly connecting the piezoelectric substrates to each other.

A bimorph electromechanical transducer 21 is prepared by forming electrodes (23a, 23b) on the both ends clamped structure. Next, conductive layers (24a, 24b) are formed (24b is not shown) to connect the outer electrodes to the electrodes (23a, 23b). This both ends clamped structure electromechanical transducer 21 can be mass-produced on a substrate as in the third embodiment. A LiNbO$_3$ substrate is prepared by forming a concavity and a penetrating hole in the process described in the third embodiment. Packages are formed by directly connecting the LiNbO$_3$ substrate on the piezoelectric substrates (22a, 22b) formed with the electromechanical transducer 21. An acceleration sensor is completed by forming the other elements, such as the outer electrodes.

The resonance frequency of the acceleration sensor having both-ends clamped structure is higher than that of an electromechanical transducer having a cantilever if the length and size are common, thus, acceleration in a higher frequency region can be measured.

The length, thickness and width of the electromechanical transducer 21 are determined based on the frequency range of the acceleration to be measured. As the frequency of the measured acceleration gets close to the resonance frequency of the electromechanical transducer 21, the sensitivity of the acceleration sensor 105 is improved. The resonance frequency should be separated sufficiently from the measurement frequency range so that the sensitivity of the acceleration sensor 105 is not greatly influenced by the frequency. For this purpose, for example, the electromechanical transducer 21 should be set so that the resonance frequency is twice the maximum measurement frequency.

In this embodiment, the electromechanical transducer 21 is prepared by a strong direct connection of the piezoelectric substrates (22a, 22b) without using adhesive layers. Therefore, a highly sensitive acceleration sensor can be obtained without characteristic variation or decrease of vibration. In addition, the electromechanical transducer 21 can be located precisely and the length and the supporting condition of the both ends clamped structure do not vary since the electromechanical transducer 21 is directly connected to the packages (27a, 27b). As a result, a small acceleration sensor which can measure at a higher frequency range will be obtained. The acceleration sensor is stable and its characteristic variation is extremely small. In this embodiment, the packages (27a, 27b) are firmly connected directly without using adhesives, and thus the heat resistance of the connecting faces is improved. Therefore, the connecting parts do not generate gases even if solder reflow is conducted, and thus every part composing the packages (27a, 27b) is air-tight sealed. As a result, a reliable acceleration sensor whose characteristics do not deteriorate can be obtained.

The material for the piezoelectric substrates (22a, 22b) is not limited to LiNbO$_3$, but other materials like LiTaO$_3$ and quartz are also used.

In this embodiment, the material for packages (27a, 27b) is not limited to LiNbO$_3$, but other materials like LiTaO$_3$, quartz, silicon, and glass can also be used. It is preferable that the material is identical to that of the piezoelectric substrates (22a, 22b) composing the electromechanical transducer 21. It is further preferable that the material has a coefficient of thermal expansion similar to that of the piezoelectric substrates (22a, 22b) composing the electromechanical transducer 21.

The Fifth Embodiment

Figure 23:
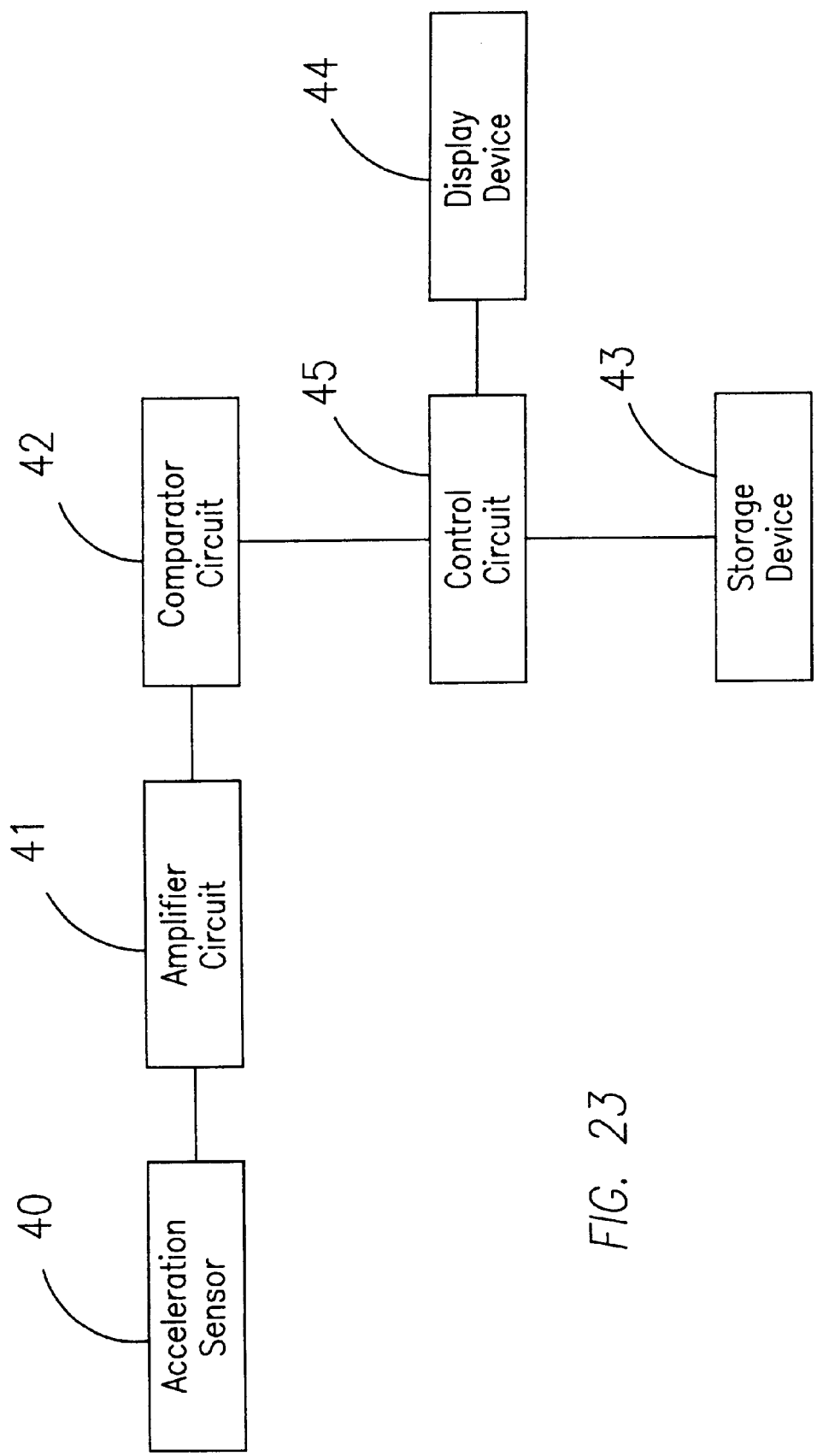
FIG. 23 is a circuit diagram of a shock detecting device of the fifth embodiment of this invention.

FIG. 23 is a circuit diagram of a shock detecting device of the fifth embodiment of this invention. As shown in FIG.

23, a shock detecting device of this invention comprises an acceleration sensor 40, an amplifier circuit 41 which transfers and amplifies signals outputted from the acceleration sensor 40, a comparator circuit 42 which compares the signals outputted from the amplifier circuit 41 with standard signals, a storage device 43 which stores shocks, a display device 44 which displays the shock, and a control circuit 45 which controls the comparator circuit 42, the storage device 43, and the display device 44. A control device of an apparatus to which this shock detecting device is set can be used partially for the control circuit 45. In this embodiment, the acceleration sensor of the first embodiment (FIG. 6) is used for the acceleration sensor 40.

Figure 24:
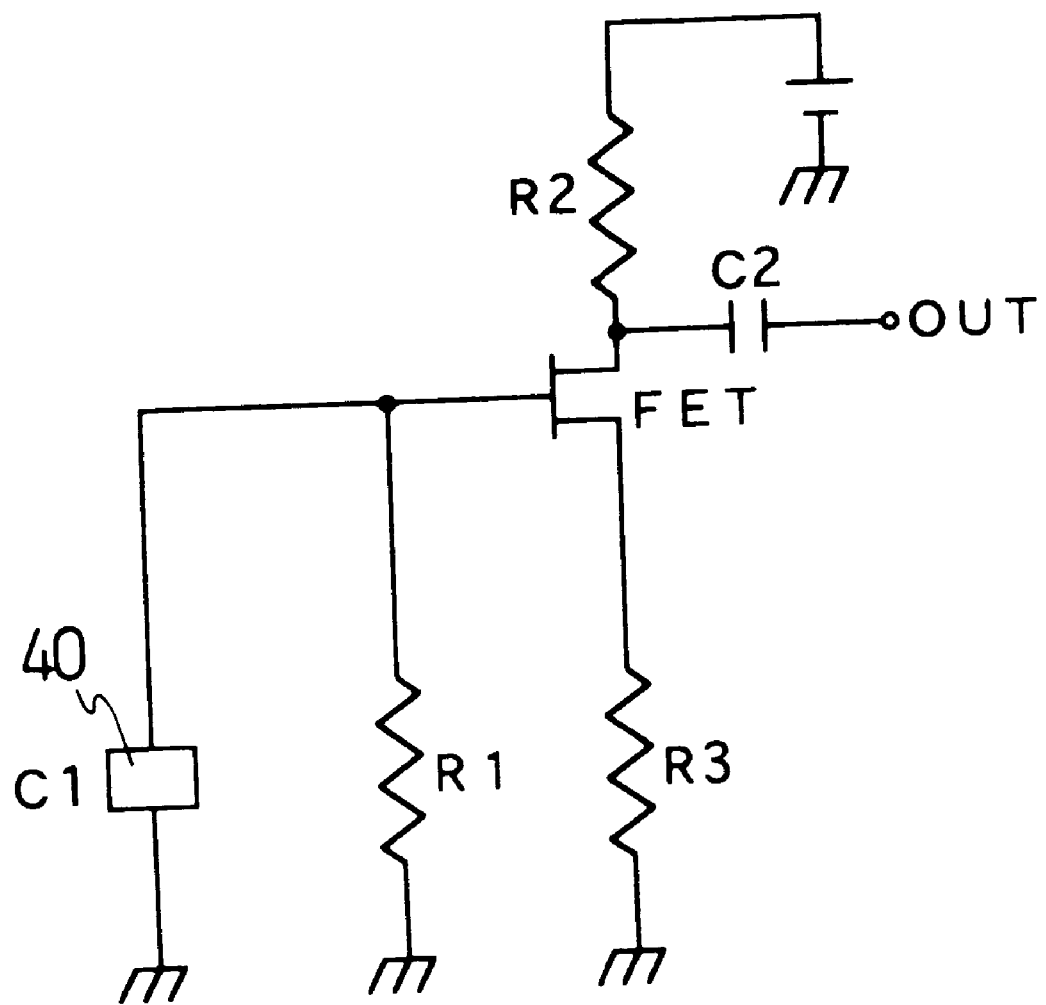
FIG. 24 is a diagram of an amplifier circuit of a shock detecting device of the fifth embodiment of this invention.

FIG. 24 is a diagram of the amplifier circuit. As shown in FIG. 24, the acceleration sensor 40 is connected to the gate of a field effect transistor (FET) in parallel to the resistance $R_1$, so signals outputted from the acceleration sensor 40 are inputted to the FET gate. The cut off frequency of the low frequency side in the frequency characteristics of this circuit depends on the resistance $R_1$ and the capacitance $C_1$ of the acceleration sensor 40, and it is expressed by the equation: $f_c = 1/2\pi R_1 C_1$. Therefore, the output is decreased if the frequency is lower than $f_c$. If the capacitance $C_1$ of the acceleration sensor 40 varies considerably, the cut off frequency $f_c$ also varies, and the lowest measurable frequency changes. In an acceleration sensor using a piezoelectric ceramic, the capacitance variation is about 20%, and the cut off frequency varies by the same degree. On the other hand, in the acceleration sensor 40 produced by directly connecting the piezoelectric single crystal substrates of this invention, the variation of the capacitance $C_1$ is only 7% or less, so the cut-off frequency $f_c$ is also stable, and as a result, a stable output can be obtained to low frequency acceleration. The signals outputted from the acceleration sensor 40 are transferred at the amplifier circuit 41 and amplified. The signals outputted from the amplifier circuit 41 are inputted to the comparator circuit 42. The comparator circuit 42 decides whether the signals from the amplifier circuit are larger than the standard signals or not.

Figure 25:
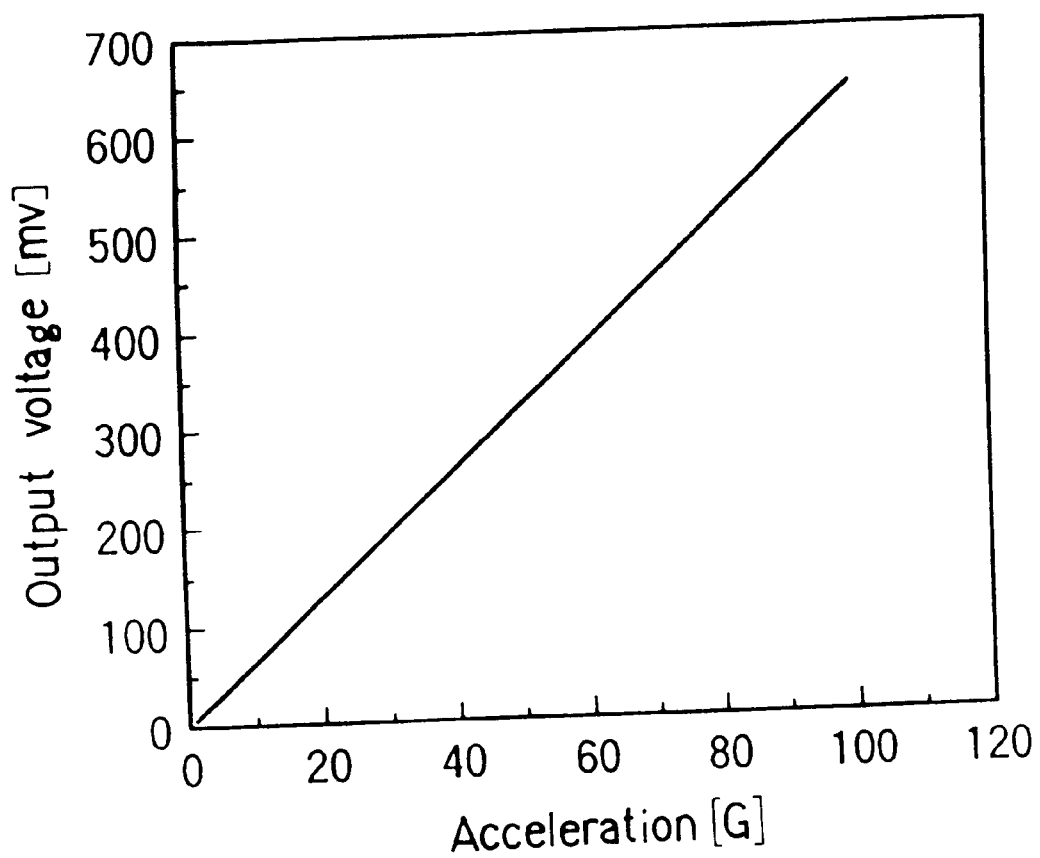
FIG. 25 is a graph showing the relationship between output and acceleration measured by using the shock detecting device of the fifth embodiment of this invention.
Figure 26:
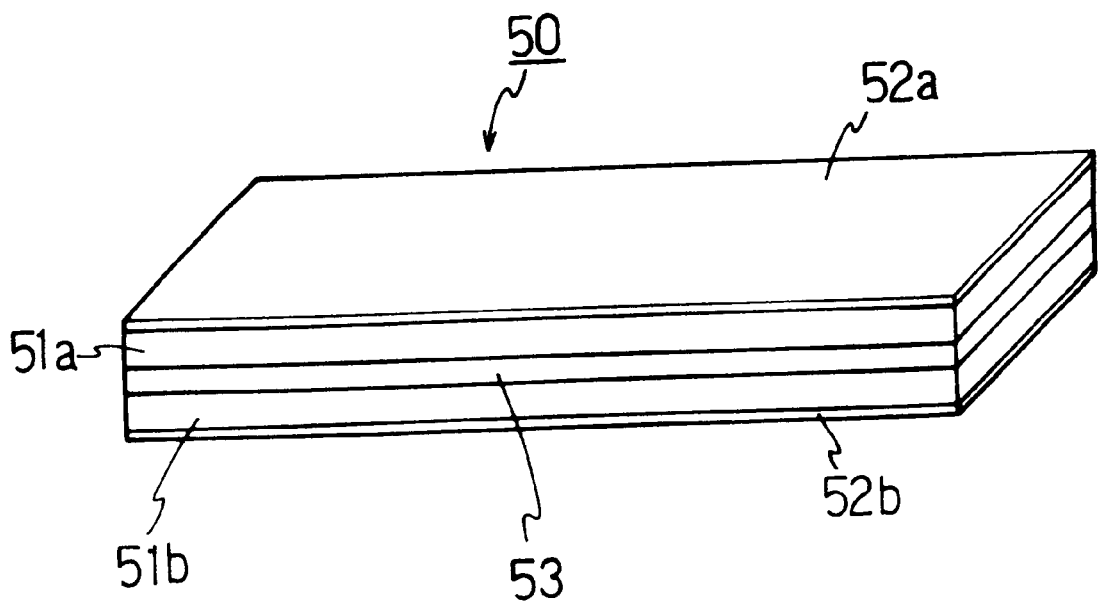
FIG. 26 is a perspective view of a bimorph electromechanical transducer according to the prior art.
Figure 27:
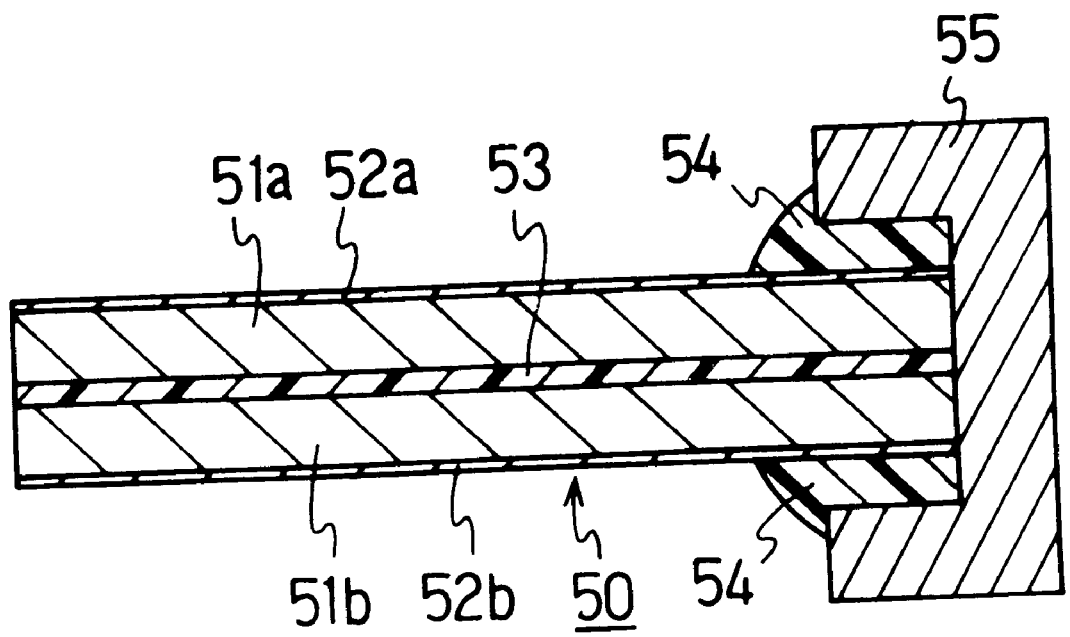
FIG. 27 is a cross-sectional view of a cantilever structure bimorph electromechanical transducer according to the prior art.
Figure 28:
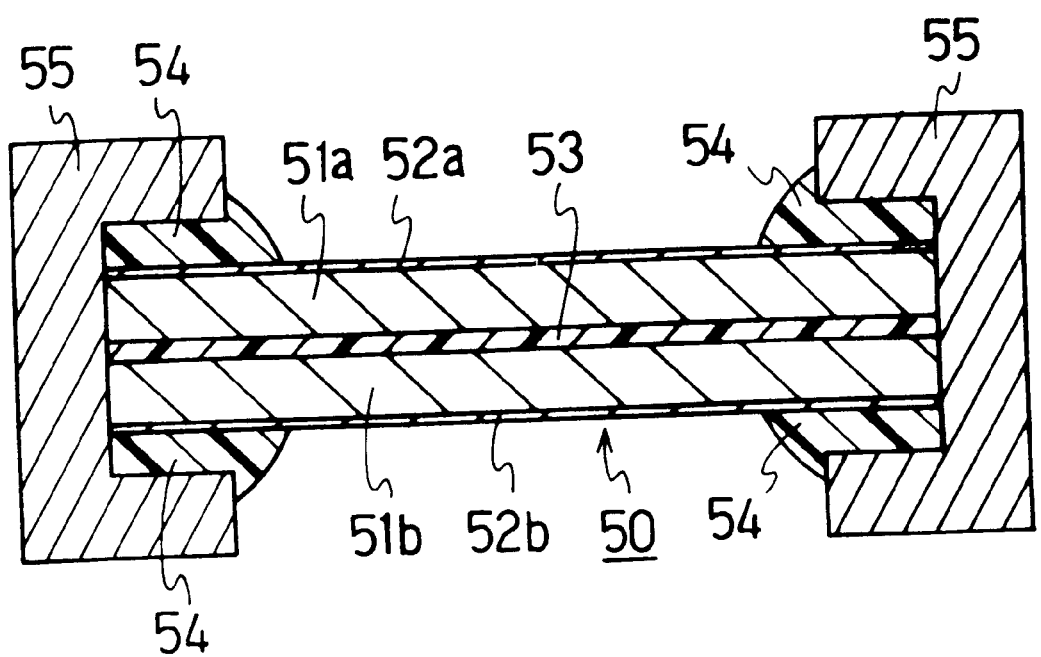
FIG. 28 is a cross-sectional view of a both-ends clamped structure bimorph electromechanical transducer according to the prior art.

The following is an example where a shock of 10G or more is recognized, recorded, and displayed. FIG. 25 is a graph showing the relationship between output voltage and acceleration where the output of the acceleration sensor described in the first embodiment is measured by using the circuits shown in FIG. 24. As shown in FIG. 25, when a 10G acceleration is applied, the signal outputted from the amplifier circuit 41 connected to the acceleration sensor 40 is 64 mV. In this case, 64 mV of standard signal is inputted from the control circuit 45 to the comparator circuit 42. This standard signal and the output signals from the amplifier circuit 41 are compared at the comparator circuit 42, and if the output signals from the amplifier circuit 41 are larger, output signals generated at the comparator circuit 42 are sent back to the control circuit 45. In this way, the control circuit 45 recognizes a shock larger than the standard 10G. The control circuit 45 can order the storage device 43 to store the shock larger than the standard 10G. At the same time, the level and the date and time of the shock can also be recorded. The control circuit 45 orders the display device 44 to display the shock larger than the standard 10G, the level and the date and time of the shock, and thus the display device 44 displays the information. The control circuit 45 can order the whole apparatus on which this shock detecting device is installed to avoid malfunction and destruction caused by the shock. In case this shock detecting device is installed in a hard disc device, the device can order it to stop writing information from the head on the disc, and to retract the head in order to avoid the situation in which the head bumps against the disc and is damaged. The shock detecting device installed in a portable phone can order self-decision on its failure.

The acceleration sensor (FIG. 6) indicated in the first embodiment is used for the shock detecting device of this invention, and thus there is no variation of sensitivity of the acceleration sensor or of the capacitance. Therefore, a shock detecting device provided by this invention realizes precise measurement of acceleration and provides accurate decisions of shocks comparing to a standard value, by using its comparator circuit. The shock detecting device having the above-mentioned configuration can decide and order some operations including detection and recording of the shock and protection of the apparatus from the shock, by using its control circuit.

This invention may be embodied in other forms without departing from the spirit or essential characteristics thereof. The embodiments disclosed in this application are to be considered in all respects as illustrative and not limitative, the scope for the invention is indicated by the appended claims rather than by the foregoing description, and all changes which come within the meaning and range of equivalency of the claims are intended to be embraced therein.

What is claimed is:

1. An acceleration sensor which comprises an electromechanical transducer having a piezoelectric element formed by directly connecting two opposite main faces of at least two piezoelectric substrates and electrodes formed on the opposite main faces of the piezoelectric element, and supporters to support the electromechanical transducer, wherein the main faces of the two piezoelectric substrates are connected by bonding the atoms of the piezoelectric substrates via at least one group selected from the group consisting of oxygen and hydroxyl groups.

2. The acceleration sensor according to claim 1, wherein the two piezoelectric substrates are connected to each other so that the directions of the polarization axes are opposite.

3. The acceleration sensor according to claim 1, wherein the two piezoelectric substrates are directly connected to each other via a buffer layer formed on a main face of one of the piezoelectric substrates.

4. The acceleration sensor according to claim 1, wherein an end of the electromechanical transducer is supported by a supporter.

5. The acceleration sensor according to claim 1, wherein both ends of the electromechanical transducer are supported by supporters.

6. The acceleration sensor according to claim 1, wherein the piezoelectric substrates comprise single crystal piezoelectric materials of 3m crystal classes, and the angle which the main face of the piezoelectric substrates makes with its Y axis is perpendicular to an axis of +129° to +152° and includes its X axis, and a line which links center of gravity of the piezoelectric substrates to the center of the supporting portion is perpendicular to the X axis, where the X axis, Y axis and Z axis are the crystal axes of the single crystal piezoelectric materials.

7. The acceleration sensor according to claim 1, wherein the piezoelectric substrates comprise single crystal piezoelectric materials of 3m crystal classes, and the angle which the main face of the piezoelectric substrates makes with its Y axis is perpendicular to an axis of −26° to +26° and includes its X axis, and a line which links center of gravity of the substrates to the center of the supporting portion is parallel to the X axis, where the X axis, Y axis and Z axis are the crystal axes of the single crystal piezoelectric materials.

8. The acceleration sensor according to claim 1, wherein the piezoelectric substrates comprise single crystal piezoelectric materials of single crystal 32 crystal classes, and the main face of the piezoelectric substrate is perpendicular to its X axis while a line which links center of gravity of the substrates to the center of the supporting portion makes an angle of from +52° to +86° with its Z axes of the substrates, where the X axis, Y axis and Z axis are the crystal axes of the single crystal piezoelectric materials.

9. The acceleration sensor according to claim 1, wherein the piezoelectric substrates comprise single crystal piezoelectric materials of 32 crystal classes, and the angle which the main face of the piezoelectric substrates makes with its X axis is perpendicular to an axis of −26° to +26° and includes its Y axis, and a line which links center of gravity of the substrates to the center of the supporting portion is parallel to the Y axis, where the X axis, Y axis and Z axis are the crystal axes of the single crystal piezoelectric materials.

10. The acceleration sensor according to claim 1, wherein the piezoelectric substrates comprise single crystal piezoelectric materials of 32 crystal classes, and the angle which the main face of the piezoelectric substrates makes with its X axis is perpendicular to an axis of +52° to +68° and includes its Z axis, and a line which links center of gravity of the substrates to the center of the supporting portion is perpendicular to the Z axis, where the X axis, Y axis and Z axis are the crystal axes of the single crystal piezoelectric materials.

11. The acceleration sensor according to claim 1, further comprising:
   an amplifier circuit which converts and amplifies signals from the acceleration sensor;
   a comparator circuit which compares the signals from the amplifier circuit with standard signals and produces an output indicative of the result of the comparison; and
   a storage device to store data regarding shock experienced by said acceleration sensor.

12. An acceleration sensor which comprises an electromechanical transducer having a piezoelectric element formed by directly connecting two opposite main faces of at least two piezoelectric substrates and electrodes formed on the two opposite main faces, and supporters to support the electromechanical transducer, where the electromechanical transducer is directly connected to the supporters, wherein the piezoelectric substrates and the supporters are connected to each other by bonding the atoms composing the substrates and supporters via at least one group selected from the group consisting of oxygen and hydroxyl groups.

13. The acceleration sensor according to claim 12, wherein the piezoelectric substrates comprising the electromechanical transducer and the supporters are directly bonded via a buffer layer formed on a main face of one of the piezoelectric substrates, on a surface of one of the supporters, or on both of them.

14. The acceleration sensor according to claim 12, wherein the piezoelectric substrates and the supporters are formed of the same material.

15. The acceleration sensor according to claim 12, wherein an end of the electromechanical transducer is supported by a supporter.

16. The acceleration sensor according to claim 12, wherein both ends of the electromechanical transducer are supported by the supporters.

17. An acceleration sensor which comprises an electromechanical transducer comprising a piezoelectric element formed by directly connecting two opposite main faces of at least two piezoelectric substrates and electrodes formed on the two opposite main faces, supporters to support the electromechanical transducer, and packages containing the electromechanical transducer, where the supporters are directly connected to the packages by bonding the atoms of the piezoelectric substrates via at least one group selected from the group consisting of oxygen and hydroxyl groups.

18. The acceleration sensor according to claim 17, wherein the packages and the supporters are connected by bonding the atoms composing the packages and the supporters via a group selected from the group consisting of oxygen and hydroxyl groups.

19. The acceleration sensor according to claim 17, wherein the packages and the supporters are directly connected to each other via a buffer layer formed on a surface of one of the packages, on a surface of one of the supporters, or on both of them.

20. The acceleration sensor according to claim 17, wherein the packages and the supporters are formed of the same material.

21. An acceleration sensor which comprises an electromechanical transducer comprising a piezoelectric element formed by directly connecting two opposite main faces of at least two piezoelectric substrates and electrodes formed on the two opposite main faces, supporters to support the electromechanical transducer, and packages containing the electromechanical transducer, where the electromechanical transducer is supported by directly connecting the piezoelectric substrates comprising the piezoelectric element to the packages by bonding the atoms of the piezoelectric substrates via at least one group selected from the group consisting of oxygen and hydroxyl groups.

22. The acceleration sensor according to claim 21, wherein the piezoelectric substrates and the packages are connected by bonding the atoms composing the piezoelectric substrates and the packages via a group selected from the group consisting of oxygen and hydroxyl groups.

23. The acceleration sensor according to claim 21, wherein the piezoelectric substrates and the packages are directly connected via a buffer layer formed on a main face of one of the piezoelectric substrates, on a surface of one of the packages, or on both of them.

24. The acceleration sensor according to claim 21, wherein the piezoelectric substrates and the packages are formed of the same material.

25. An acceleration sensor which comprises an electromechanical transducer comprising a piezoelectric element formed by directly connecting two opposite main faces of at least two piezoelectric substrates and electrodes formed on the two opposite main faces, supporters to support the electromechanical transducer, and packages comprising at least two parts to contain the electromechanical transducer, where the two parts comprising packages are directly connected to each other by bonding the atoms of the piezoelectric substrates via at least one group selected from the group consisting of oxygen and hydroxyl groups.

26. The acceleration sensor according to claim 25, wherein the parts comprising the packages are connected to each other by bonding their atoms via a group selected from the group consisting of oxygen and hydroxyl groups.

27. The acceleration sensor according to claim 25, wherein the parts comprising the packages are directly connected to each other via a buffer layer formed on a face of a component selected from the group consisting of the piezoelectric substrates, the supporters and the packages.

* * * * *